US012787685B2

(12) United States Patent
Choi

(10) Patent No.: US 12,787,685 B2
(45) Date of Patent: Nov. 3, 2026

(54) APPARATUS INCLUDING A NON-CONTACT DIE HEAD AND A SUBSTRATE CHUCK AND A METHOD OF USING THE SAME

(71) Applicant: CANON KABUSHIKI KAISHA, Tokyo (JP)

(72) Inventor: Byung-Jin Choi, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 935 days.

(21) Appl. No.: 18/061,063

(22) Filed: Dec. 2, 2022

(65) Prior Publication Data

US 2024/0186157 A1 Jun. 6, 2024

(51) Int. Cl.
*H10P 72/00* (2026.01)
*B65G 47/90* (2006.01)
*H10W 80/00* (2026.01)

(52) U.S. Cl.
CPC .......... *H10P 72/0446* (2026.01); *B65G 47/90* (2013.01); *H10W 80/312* (2026.01); *H10W 80/327* (2026.01)

(58) Field of Classification Search
CPC ..... H10P 72/0446; H10P 72/78; B65G 47/90; H10W 80/312; H10W 80/327
See application file for complete search history.

(56) References Cited

U.S. PATENT DOCUMENTS 5,270,260 A 12/1993 Scheuenpflug
6,599,402 B2 * 7/2003 Dordi .................. H10P 72/7606 204/224 R
7,292,427 B1 * 11/2007 Murdoch ............ H10P 72/7604 361/234
8,465,011 B2 * 6/2013 Segawa ............... H10P 72/0442 156/707

(Continued)

FOREIGN PATENT DOCUMENTS

CN 101529577 A * 9/2009 ....... H01L 21/67132
CN 109524313 A * 3/2019 ............ H10P 72/722

(Continued)

OTHER PUBLICATIONS

Translation of CN-101529577-A (Year: 2009).*

(Continued)

*Primary Examiner* — Jeffrey T Carley
(74) *Attorney, Agent, or Firm* — Abel Schillinger, LLP

(57) ABSTRACT

An apparatus can include a pick-up head including a non-contact die chuck for holding a die; a substrate chuck having a non-planar chucking surface configured to hold a source substrate; and a substrate retention module that is configured to provide a force in a direction from the source substrate toward the substrate chuck, wherein the force is sufficient to deform the source substrate. A method of using the apparatus can include placing a source substrate along a non-planar chucking surface of a source chuck, wherein a die is associated with the source substrate; and picking up the die (Continued)

from the source substrate using a pick-up head having a non-contact die chuck, wherein before picking up the die, the source substrate contacts spaced-apart portions of the die, and the source substrate does not contact another portion of die between the spaced-apart portions of the source substrate.

21 Claims, 16 Drawing Sheets

(56) References Cited

U.S. PATENT DOCUMENTS

| | | | | |
|---|---|---|---|---|
| 8,715,457 | B2 * | 5/2014 | Behler | H10P 72/0442 156/707 |
| 8,967,935 | B2 * | 3/2015 | Goodman | H10P 72/0428 414/222.01 |
| 9,196,520 | B1 | 11/2015 | Sanchez | |
| 9,233,455 | B2 * | 1/2016 | Ooi | B25B 11/005 |
| 10,468,290 | B2 * | 11/2019 | Ellis | H10P 72/78 |
| 11,990,445 | B2 | 5/2024 | Sen | |
| 2004/0038498 | A1 * | 2/2004 | Ozono | H10P 72/0442 438/464 |
| 2004/0038499 | A1 * | 2/2004 | Kim | H10P 72/78 438/464 |
| 2004/0238117 | A1 * | 12/2004 | Kasai | H10P 72/0442 156/716 |
| 2008/0229811 | A1 * | 9/2008 | Zhao | B25B 11/005 73/104 |
| 2009/0175705 | A1 * | 7/2009 | Nakao | H10P 72/0431 269/21 |
| 2017/0142874 | A1 | 5/2017 | Pourchet et al. | |
| 2019/0027388 | A1 * | 1/2019 | Seyama | H10P 72/0446 |
| 2021/0060798 | A1 * | 3/2021 | Jeong | B25J 15/0616 |
| 2021/0066112 | A1 | 3/2021 | Jeong | |
| 2023/0245996 | A1 | 8/2023 | Sreenivasan | |
| 2024/0178015 | A1 * | 5/2024 | Wu | H10P 72/0442 |

FOREIGN PATENT DOCUMENTS

| | | | | | |
|---|---|---|---|---|---|
| JP | 2020189426 | A | | 11/2020 | |
| KR | 102386337 | B1 | * | 4/2022 | H01L 21/67712 |
| TW | 201033100 | A | * | 9/2010 | H10P 72/0441 |
| TW | 202014074 | A | | 4/2020 | |
| WO | 2022212260 | A1 | | 10/2022 | |
| WO | 2023056068 | A1 | | 4/2023 | |
| WO | 2023056072 | A1 | | 4/2023 | |

OTHER PUBLICATIONS

Translation of KR-102386337-B1 (Year: 2019).*
Translation of CN-109524313-A (Year: 2019).*
Translation of TW-201033100-A (Year: 2010).*

* cited by examiner

APPARATUS INCLUDING A NON-CONTACT DIE HEAD AND A SUBSTRATE CHUCK AND A METHOD OF USING THE SAME

FIELD OF THE DISCLOSURE

The present disclosure relates to apparatuses including die heads and substrate chucks and methods of using the apparatuses.

RELATED ART

Advanced packaging technologies demand high throughput, yet precise placement of dies continues to be more difficult. Hybrid bonding can be particularly challenging with small misalignment tolerances. A single-chip transfer technique can achieve high precision but has a low throughput. A multi-chip transfer technique can achieve the high throughput but precise placement of dies can be difficult. A need exists for a placement that is high throughput while still meeting specifications for chip placement.

SUMMARY

In an aspect, an apparatus can include a first pick-up head including a first non-contact die chuck for holding a first die, wherein the first die is associated with a source substrate; a substrate chuck having a non-planar chucking surface configured to hold the source substrate; and a substrate retention module that is configured to provide a force in a direction from the source substrate toward the substrate chuck, wherein the force is sufficient to deform the source substrate.

In an embodiment, the apparatus includes an array of pick-up heads including the first pick-up head and a second pick-up head including a second non-contact die chuck, and the first pick-up head and the second pick-up head are configured to pick up the first die and a second die that are at an original die pitch along the source substrate.

In another embodiment, the non-planar chucking surface of the substrate chuck has a feature pitch that is less than a smaller of a length and a width of the first die.

In a particular embodiment, the non-planar chucking surface includes a plurality of concentric rings.

In another particular embodiment, the non-planar chucking surface includes a plurality of pyramidal shapes or a plurality of conical shapes.

In a further embodiment, the first pick-up head includes a die retention module.

In a particular embodiment, the die retention module includes a pressure source and a pressure actuator.

In another particular embodiment, the die retention module includes a vacuum source and a vacuum actuator.

In still another embodiment, the apparatus can further include a bonding head configured to receive the first die from the first pick-up head and bond the first die to a destination substrate.

In yet another embodiment, the apparatus can further include a piezoelectric transducer that is a part of or coupled to the first pick-up head.

In a further embodiment, the first non-contact die chuck includes a Bernoulli chuck.

In another embodiment, the substrate chuck includes features along the non-planar chucking surface, wherein the features are arranged at a feature pitch.

In another aspect, a method can include placing a source substrate along a non-planar chucking surface of a source chuck, wherein a first die is associated with the source substrate; and picking up the first die using a first pick-up head having a first non-contact die chuck. Before picking up the first die, the source substrate can contact spaced-apart portions of the first die, and the source substrate may not contact another portion of first die between the spaced-apart portions of the source substrate.

In an embodiment, the method can further include activating a substrate retention module, wherein the substrate retention module provides a force on the source substrate in a direction from the source substrate toward the source chuck and deforms the source substrate, and activating the substrate retention module is performed such that the source substrate is deformed before picking up the first die.

In a particular embodiment, activating the substrate retention module is performed such that the source substrate at least partially conforms to the non-planar chucking surface of the source chuck.

In another embodiment, picking up the first die includes activating a die retention module, and during picking up the first die, a gas flows between the spaced-apart portions of the source substrate and the first die.

In still another embodiment, before placing the source substrate along the non-planar chucking surface of the source chuck, the source substrate contacts spaced-apart portions of the first die, and the source substrate does not contact another portion of first die between the spaced-apart portions of the source substrate.

In yet another embodiment, placing the source substrate along the non-planar chucking surface of the source chuck includes placing the source substrate along the non-planar chucking surface, wherein a plurality of dies is associated with the source substrate, wherein the plurality of dies includes the first die and a second die that are immediately adjacent to and along opposite sides of a cut lane. Picking up the first die includes picking up the first die with the first pick-up head and picking up the second die with a second pick-up head having a second non-contact die chuck, wherein the first pick-up head and second pick-up head are at a source-matching pitch. The method can further includes changing the first pick-up head and the second pick-up head from the source-matching pitch to a bonding head-matching pitch; and bonding the first die and the second die to destination bonding sites of a destination substrate, wherein the destination substrate is coupled to a destination chuck, and the destination substrate has a corresponding first die location and a corresponding second die location that are at a destination pitch.

In a further embodiment, placing the source substrate along the non-planar chucking surface of the source chuck includes placing the source substrate along the non-planar chucking surface, wherein a plurality of dies is associated with the source substrate, wherein the plurality of dies includes the first die and a second die that face a first direction. Picking up the first die includes picking up the first die with the first pick-up head and picking up the second die with a second pick-up head having a second non-contact die chuck, wherein the first non-contact die chuck and the second non-contact die chuck have pick-up surfaces that face a second direction opposite the first direction, and the first pick-up head and second pick-up head are at a source-matching pitch. The method can further include changing the first pick-up head and the second pick-up head from the source-matching pitch to a bonding head-matching pitch; transferring the first die to a first bonding head and the second die to a second bonding head; and bonding the first die to a first destination bonding site of a destination substrate and the second die to a second destination bonding site of the destination substrate, wherein the destination substrate is coupled to a destination chuck, and the first destination bonding site and the second destination bonding site face the second direction and are at a destination pitch.

In a particular embodiment, during placing the source substrate, picking up the first die and the second die, changing the first pick-up head and the second pick-up head from the source-matching pitch to the bonding head-matching pitch, transferring the first die to the first bonding head and the second die to the second bonding head, and bonding the first die and the second die, activated surfaces of the first die and the second die face the first direction.

In another embodiment, picking up the first die is performed while a plurality of push pins within the source chuck are in a retracted state.

BRIEF DESCRIPTION OF THE DRAWINGS

Implementations are illustrated by way of example and are not limited in the accompanying figures.

Figure 1:
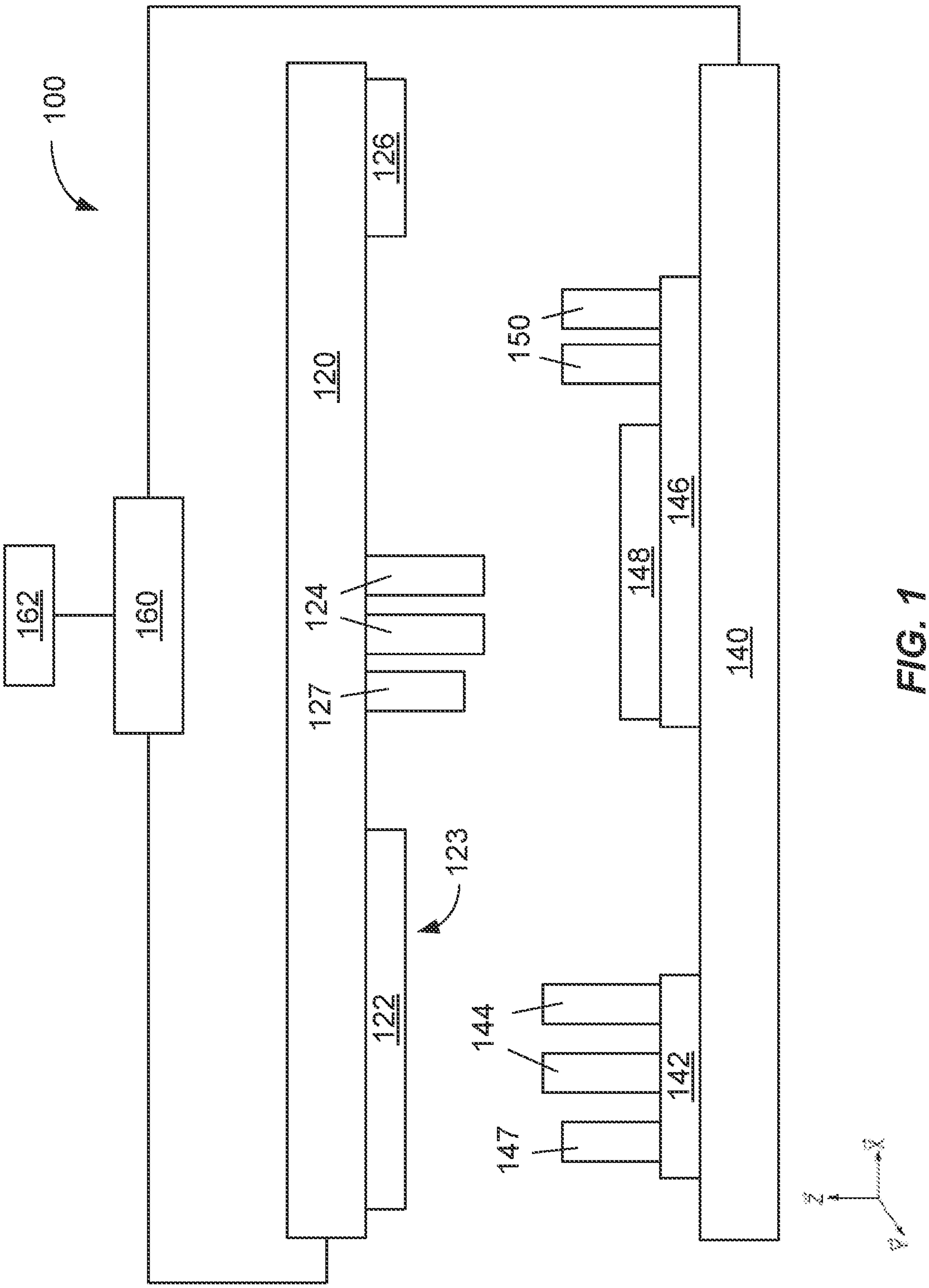
FIG. 1 includes a conceptual view of an apparatus that can be used in transferring dies associated with a source substrate to a destination substrate.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations and implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

An apparatus can include a substrate chuck or be used with a source substrate that can aid when using a non-contact die chuck. In an aspect, the substrate chuck can have a non-planar chucking surface configured to hold the source substrate. The apparatus can further include a substrate retention module that is configured to provide a force in a direction from the source substrate toward the substrate chuck, wherein the force is sufficient to deform the source substrate. The substrate retention module can be a vacuum system to provide a vacuum along the chucking surface, an electrical system configured to provide an electrostatic charge along the chucking surface, or an electromagnetic system configured to provide a magnetic field along the chucking surface. The source substrate can be placed along a non-planar chucking surface of a source chuck, wherein one or more dies are associated with the source substrate. For example, the one or more dies can be attached to a source substrate. In another example, the one or more dies may be part of the source substrate. The source substrate can be deformed to conform at least partially to the chucking surface. The deformation reduces the contact area between an adhesive layer and the one or more dies. Less force is required by the non-contact pick-up chuck when picking up a die due to the reduced contact area between the die and the adhesive layer.

In another aspect, the source substrate can have a patterned adhesive layer. Similar to the deformed source substrate, the patterned adhesive layer reduces the contact area between an adhesive layer and the one or more dies as compared to an unpatterned adhesive layer that contacts substantially all of a side of the one or more dies. Less force is required by the non-contact pick-up chuck when picking up a die due to the reduced contact area between the die and the patterned adhesive layer.

FIG. 1 includes a conceptual diagram of an apparatus 100 that can be used to transfer dies from a source substrate coupled to a source chuck 122 to a destination substrate coupled to a destination chuck 148. FIG. 1 includes the equipment configuration of the apparatus 100 and does not include the dies, the source substrate, and the destination substrate. The apparatus 100 includes a bridge 120, a base 140, and a controller 160 that is coupled to the bridge 120, the base 140, or to one or more components coupled to the bridge 120 or the base 140. The bridge 120 can be coupled to a source chuck 122, an array of bonding heads 124, a reference 126 having one or more alignment marks, and registration hardware 127 used for registration and metrology. The base 140 can be coupled to a pick-up head carriage 142 and a destination carriage 146.

In FIG. 1 and other figures, the bridge 120, the base 140, and components physically coupled between the bridge 120 or the base 140 can be organized along an X-direction, a Y-direction, a Z-direction, or a combination thereof. With respect to cross-sectional or side views, the X-direction is between the left-hand and right-hand sides of the drawings, the Z-direction is between the top and bottom of the drawings, and the Y-direction is into and out of the drawing sheet. Unless explicitly stated to the contrary, rotation occurs along an X-Y plane defined by the X-direction and the Y-direction.

Components within the apparatus 100 will be generally described in the order in which a set of dies will be transferred from a source substrate coupled to the source chuck 122 to a destination substrate coupled to the destination chuck 148. Due to similarities in operation, the pick-up head carriage 142 and the destination carriage 146 are described in the same passage later in this specification.

The terms "transfer operation" and "transfer cycle" are addressed to aid in understanding embodiments as described herein. A transfer operation starts no later than picking up a set of dies from the source substrate, where the set of dies will be the first set of dies associated with the source substrate bonded to the destination substrate and ends when the last set of dies is transferred from the source substrate to the destination substrate. A transfer cycle starts no later than with picking up a particular set of dies from the source substrate until that same particular set of dies is transferred to the destination substrate. A transfer operation can include one or more transfer cycles.

The source chuck 122 can be a vacuum chuck, a pin-type chuck, a groove-type chuck, an electrostatic chuck, an electromagnetic chuck, or the like. The source chuck 122 can be coupled to the bridge 120 by being attached to the bridge directly or can be coupled to the bridge via a carriage (not illustrated). The carriage may be able to provide translating motion as described in more detail below with respect to the pick-up head carriage 142 and the destination carriage 146. The source chuck 122 has a chucking surface 123 that faces the base 140 or a component coupled to the base 140. As will be addressed below, source chucks **122*a*, 122*b*, 122*c*, and 122*d* are particular designs with features that can be at a feature pitch that can be used for the source chuck 122. Chucking surfaces 123*a*, 123*b*, 123*c*, and 123*d* are particular designs that can be used for the chucking surface 123**.

Figure 2:
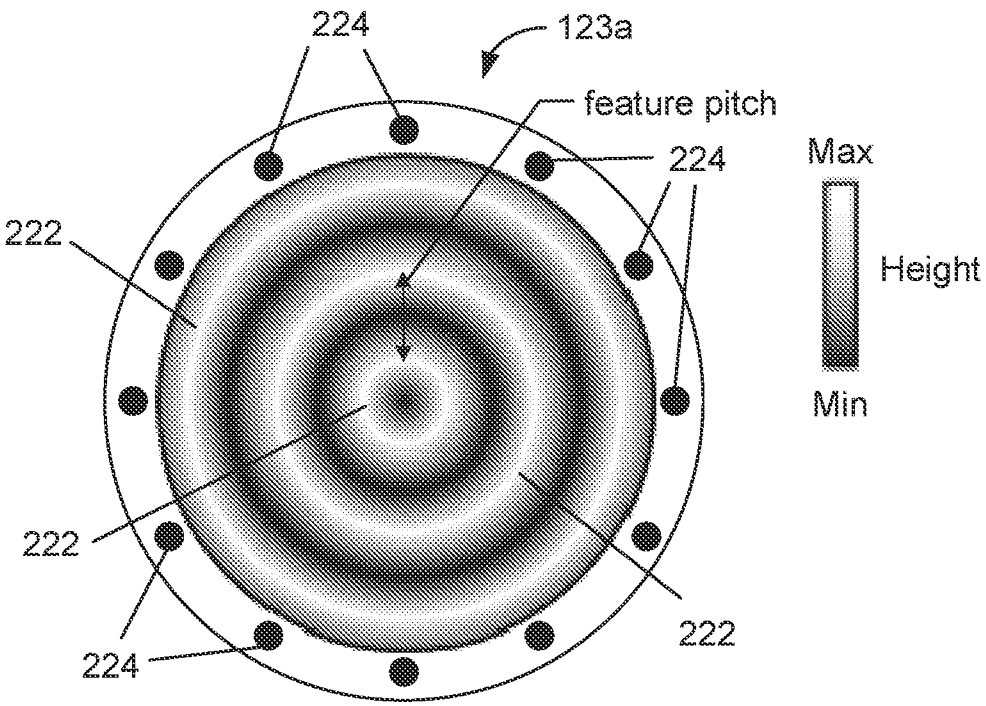
FIGS. 2 and 3 include illustrations of a bottom view and a cross-sectional view of a source chuck in accordance with an embodiment.

In an embodiment, the chucking surface **123*a* can include a plurality of concentric rings. FIG. 2 includes a bottom view of the chucking surface 123*a* that faces the base 140 or a component coupled to the base 140, and FIG. 3 includes a cross-sectional view of a portion of the source chuck 122*a* in FIG. 2. The chucking surface 123*a* has concentric rings 222. The source chuck 122*a* includes push pins 224 that are used to raise and lower a substrate with respect to the chucking surface 123*a*. In practice, the chucking surface 123*a*** can include more rings but are not illustrated to allow for a better understanding of the concentric ring design.

The tops of the peaks 322 and the bottoms of the valleys 324 corresponding to the concentric rings 222 along the chucking surface **123*a* can be rounded. In a cross-sectional view, the transitions between the tops of the peaks 322 and the bottoms of the valleys 324 may lie along straight lines. In another embodiment, the transitions between the tops of the peaks 322 and the bottoms of the valleys 324 may lie along curved lines. For example, from the cross-sectional view, the chucking surface 123** can have a sinusoidal shape.

Figure 3:
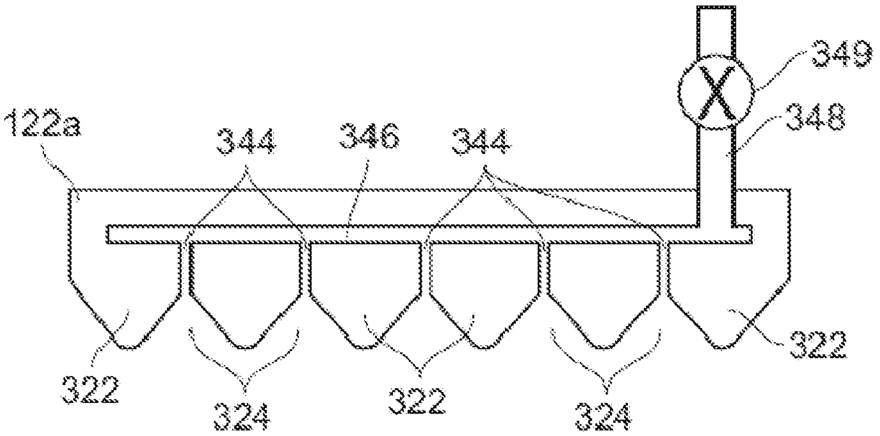

A substrate retention module can include a vacuum system. As illustrated in FIG. 3, the vacuum system can include vacuum ports 344, a vacuum manifold 346, a vacuum line 348, and an actuator 349. The vacuum ports 344 are coupled between the valleys 324 and the vacuum manifold 346. More or fewer vacuum ports 344 may be used. The vacuum ports 344 can be along each valley 324. After reading this specification, skilled artisans will be able to determine the number and locations of vacuum ports 344. The actuator 349 can be along the vacuum line 348 that is coupled to the vacuum manifold 346. The actuator 349 can be a valve, a regulator, or the like. The actuator 349 can be electronically coupled to the controller 160 (FIG. 1) or a local controller within the bridge 120 or the source chuck 122 to control the vacuum within the vacuum manifold 346. The vacuum line 348 can be coupled to a vacuum source within the apparatus 100 or outside the apparatus 100. The vacuum source is configured to provide a vacuum sufficient to deform a source substrate that will be coupled to the source chuck **122*a* along the chucking surface 123*a***.

Figure 4:
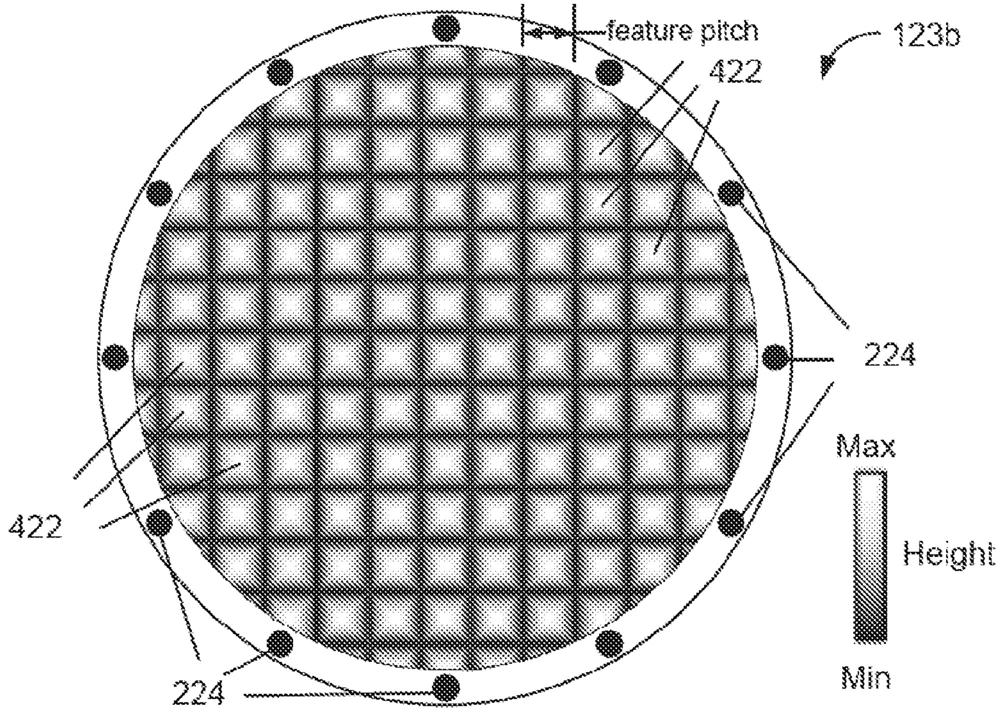
FIGS. 4 and 5 include illustrations of a bottom view and a cross-sectional view of a source chuck in accordance with another embodiment.
Figure 5:
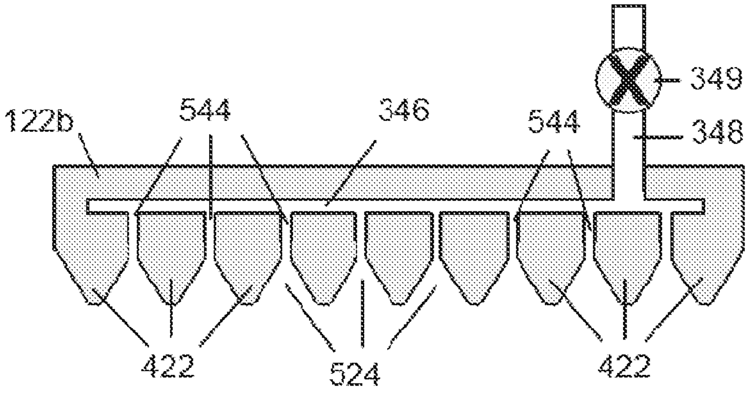

In another embodiment, a chucking surface **123*b* can include a plurality of pyramidal shapes. FIG. 4 includes a bottom view of the chucking surface 123*b* that faces the base 140 or a component coupled to the base 140, and FIG. 5 includes a cross-sectional view of a portion of the source chuck 122*b* in FIG. 4. The chucking surface 123*b* has pyramidal shapes 422. The source chuck 122*b* includes the push pins 224 as previously described. Referring to FIG. 5, valleys 524 correspond to locations between the pyramidal shapes 422. The tops of the pyramidal shapes 422 can be flattened (as illustrated), rounded, or pointed. The transitions between the tops of the pyramidal shapes 422 and the bottoms of the valleys 524** may lie along straight lines.

As illustrated in FIG. 5, the vacuum system can include vacuum ports 544, the vacuum manifold 346, the vacuum line 348, and the actuator 349. The vacuum ports 544 are coupled between the valleys 524 and the vacuum manifold 346. More or fewer vacuum ports 544 may be used. After reading this specification, skilled artisans will be able to determine the number and locations of vacuum ports 544. The configuration of the vacuum manifold 346, the vacuum line 348, the actuator 349, and the vacuum source can be of any configuration previously described with respect to FIG. 3.

Figure 6:
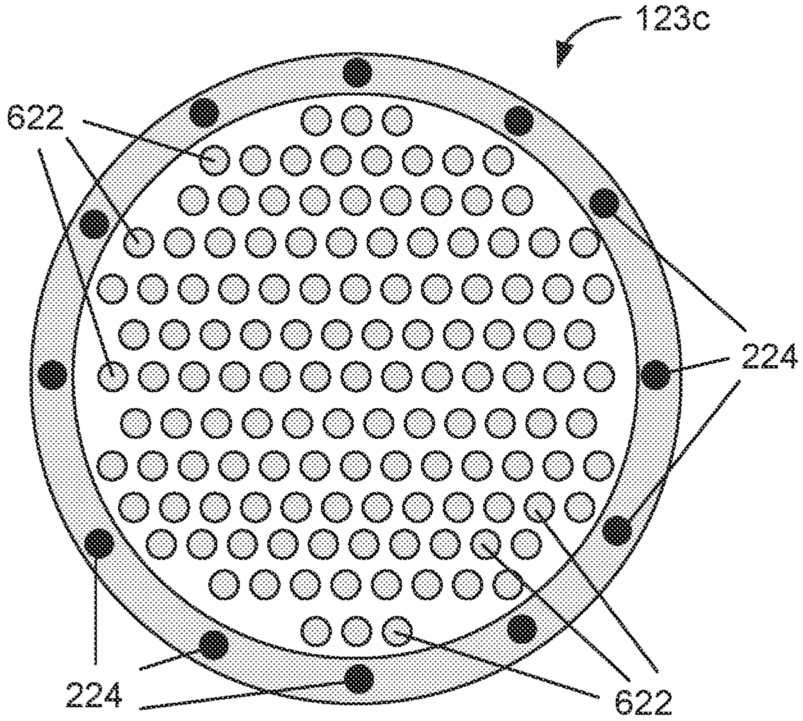
FIGS. 6 and 7 include illustrations of a bottom view and a cross-sectional view of a source chuck in accordance with a further embodiment.

In a further embodiment, a chucking surface **123*c* can include a plurality of conical shapes 622. FIG. 6 includes a bottom view of the chucking surface 123*c* that faces the base 140 or a component coupled to the base 140, and FIG. 7 includes a cross-sectional view of a portion of a source chuck 122*c* in FIG. 6. The tops of the conical shapes 622 can be rounded (illustrated) or flattened similar to the pyramidal shapes 422. In a cross-sectional view, the transitions between the tops of the conical shapes 622 and gaps 724 between the conical shapes may lie along straight lines. In another embodiment, the transitions between the tops of the conical shapes 622 and the gaps 724 may lie along curved lines. The conical shapes 622** may be replaced by hemispheres.

Figure 7:
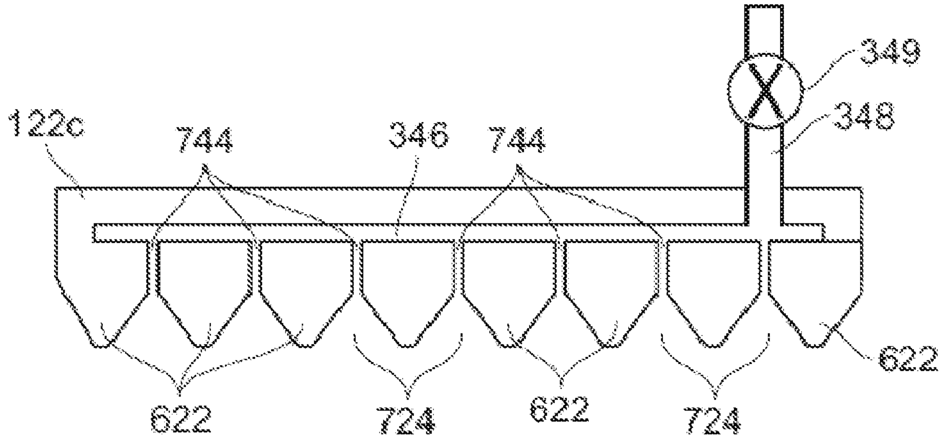

As illustrated in FIG. 7, the vacuum system can include vacuum ports 744, the vacuum manifold 346, the vacuum line 348, and the actuator 349. The vacuum ports 744 are coupled between the gaps 724 and the vacuum manifold 346. More or fewer vacuum ports 744 may be used. The vacuum ports 744 can be along each gap 724. After reading this specification, skilled artisans will be able to determine the number and locations of vacuum ports 744. The configuration of the vacuum manifold 346, the vacuum line 348, the actuator 349, and the vacuum source can be of any configuration previously described with respect to FIG. 3.

As illustrated in FIGS. 3 to 7, the substrate chucks have chucking surfaces that include features, such as concentric rings, pyramidal shapes, and conical shapes. Other shapes can be used for the features. The features along the chucking surface 123 can be at a feature pitch that will be less than the width and less than the length of a smallest die for which the apparatus 100 is designed to transfer such die associated with the source substrate. The feature pitch can be in a range from 0.5 mm to 2.0 mm. Chiplets can be very small die, and very large die can be microprocessors or graphic processing units. The die pitch for the source substrate, also referred to as the source pitch, may be smaller than 0.5 mm with very small die sizes and greater than 2.0 mm for very large die sizes. The size of feature pitch for features along the chucking surface 123 illustrated in the figures is for illustration purposes only, and a smaller feature pitch relative to the size of the chucking surface 123 will typically be used.

The heights (Z-direction dimension) of the features can be the elevation difference between a top of a feature and a bottom of its immediately adjacent valley. The heights can be in a range from 25 microns to 200 microns. The heights of the features can be outside the range if needed or desired to obtain gas flow characteristics for the gas channels between the backing sheet of a tape and the back sides of the dies being transferred.

With respect to FIGS. 3 to 7, the arrangement of features along a chucking surface can be organized as a grid of rows and columns as illustrated in FIG. 4 or have a staggered arrangement as illustrated in FIG. 6. Thus, the pyramidal shapes 422 may be placed in a staggered arrangement, or the conical shapes 622 may be organized as a grid of rows and columns. Features may abut other features as illustrated in FIG. 4 or may be spaced apart as illustrated in FIG. 6. Thus, the pyramidal shapes 422 may be spaced apart with gaps, or the conical shapes 622 may abut other conical shapes 622. In an embodiment, the features are arranged periodically across the chucking surfaces, and thus, the features are arranged at a feature pitch. In an alternative embodiment, the features are not arranged periodically but have sufficient distance from each other to ensure that each die is only partially attached to the source substrate 1032 (illustrated in FIG. 10) when the substrate retention module provides a force to deform the substrate.

In the embodiments illustrated in FIGS. 2 to 7, the substrate retention module can be a vacuum system. In another embodiment, the substrate retention module can include one or more electrical members that can generate a sufficient electrostatic charge or magnetic field so that the source substrate can be pulled into the valleys along the chucking surface 123. The source substrate may include a thin layer of a metallic or ferromagnetic material, where the thickness is sufficiently thin to allow the source substrate to deform. In an embodiment, a feature of the substrate retention module is the ability to supply a pulling force that causes portions of the source substrate to conform at least partially to the shape of the chucking surface 123, while the dies (which are attached to the source substrate and are not as flexible as the source substrate) do not conform causing partial delamination of the source substrate from the dies as portions of the source substrate are pulled away from the die. This pulling force may be vacuum, electrostatic, magnetic, chemical, or mechanical.

Referring to FIG. 1, the pick-up head carriage 142 and the destination carriage 146 are coupled to the base 140 and can provide translating motion along the base 140 in the X-direction, the Y-direction, or the Z-direction or rotational motion about one or more of axes, such as rotation about a Z-axis and along a plane lying along the X-direction and Y-direction. The pick-up head carriage 142 and the destination carriage 146 can be moved together or independently relative to each other. The pick-up head carriage 142 and the destination carriage 146 can be the same type or different types of carriages.

The array of pick-up heads 144 are coupled to the pick-up head carriage 142 and have pick-up chucks that face the bridge 120 or a component coupled to the bridge 120. At least one of the pick-up heads 144 has a body and a non-contact pick-up chuck, where the body is disposed between such pick-up head carriage 142 and the non-contact pick-up chuck. The non-contact pick-up chuck can have a pick-up surface that faces the bridge 120 or a component coupled to the bridge 120. Details regarding non-contact pick-up chucks are described later in this specification.

The array of pick-up heads 144 can be configured as a vector (a row or a column of pick-up heads) or as a matrix (at least two rows and at least two columns of pick-up heads). Regarding the matrix, the number of pick-up heads within the array of pick-up heads 144 may be different between rows, between columns, or between rows and columns. Some array configurations can be 3×1, 6×1, 2×2, 2×3, 10×10, or another rectangular shape, where the first number corresponds to the number of pick-up heads along a row or column, and the second number corresponds to the number of pick-up heads along the other of the row or column. In theory, dies from an entire source wafer could be transferred all at once. For such a configuration, the array of pick-up heads 144 may have fewer pick-up heads along rows closer to the top and bottom of the array as compared to the row or the pair of rows closest to the center of the array, and the array of pick-up heads 144 may have fewer pick-up heads along columns closer to the left-hand side and right-hand side of the array as compared to the column or the pair of columns closest to the center of the array. After reading this specification, skilled artisans will be able to determine an array configuration for the array of pick-up heads 144 that meets the needs or desires for a particular application.

The array of pick-up heads 144 can be configured to have an adjustable pitch that can be reversibly changed between a source-matching pitch and a bonding head-matching pitch. The array of pick-up heads 144 or the pick-up head carriage 142 can include motors, electrical components, or the like that can be activated to move pick-up heads to achieve a desired pitch. The apparatus 100 can be configured to allow at least one pitch change per transfer cycle. On average, the pitch for the array of pick-up heads 144 can change twice during a transfer cycle. As used herein, a pitch is the sum of a width or a length of a feature and the space between the feature and the immediately adjacent feature. The features can be dies associated with a source substrate, pick-up heads within the array of pick-up heads 144, bonding heads within the array of bonding heads 124, destination bonding sites or die locations of the destination substrate, or features along the chucking surface 123 of a source substrate 122. The pitch along the X-direction may be the same or different from the pitch in the Y-direction. Changing the pitch of the pick-up heads is only necessary if the pitches of the source and the bonding heads are different. In an alternative embodiment, the pitch of the pick-up heads and the pitch of the bonding heads are the same.

In an embodiment, the array of pick-up heads 144 can be at the source-matching pitch when picking up a set of dies from the source chuck 122 and at the bonding head-matching pitch when transferring the dies to the array of bonding heads 124. The source-matching pitch for the array of pick-up heads 144 should be the same as the source pitch of dies to be picked up from a source substrate that is coupled to the source chuck 122, and the bonding head-matching pitch for the array of pick-up heads 144 should be the same as a bonding head pitch for bonding heads within the array of bonding heads 124. In practice, the source-matching pitch is usually slightly different from the source pitch, and the bonding head-matching pitch is usually slightly different from the bonding head pitch. A successful chip transfer can occur when the difference between the source-matching pitch and the source pitch, the difference between the bonding head-matching pitch and the bonding head pitch, or both are within acceptable tolerances. A tolerance may be specified in a production specification associated with equipment or a method when using the equipment.

After the dies are transferred to the array of bonding heads 124, the pitch for the array of pick-up heads 144 can be changed back to the source-matching pitch before picking up the next set of dies for the next transfer cycle. The changing of the pitch can be performed with or without human intervention. In an embodiment, a signal from the bridge 120, base 140, or any one or more components coupled to the bridge 120 or base 140 can be transmitted to the controller 160, and the controller can transmit a signal to change the pitch for the array of pick-up heads 144. For example, after the array of pick-up heads 144 have picked up a set of dies from the source substrate, a signal can be transmitted to the controller 160 that the picking up the set of dies has been completed. In response to the signal, the controller 160 can transmit a signal to change the pitch for the array of pick-up heads 144 from the source-matching pitch to the bonding head-matching pitch. After the array of pick-up heads 144 have transferred the set of dies to the array of bonding heads 124, a signal can be transmitted to the controller 160 that the transfer from the pick-up heads to the bonding heads has been completed. In response to the signal, the controller 160 can transmit a signal to change the pitch for the array of pick-up heads 144 from the bonding head-matching pitch to the source-matching pitch.

The array of bonding heads 124 are coupled to the bridge 120. At least one of the bonding heads within the array of bonding heads 124 can include a die chuck and a body disposed between the die chuck and the bridge 120. The die chuck faces the base 140 or a component coupled to the base 140. The die chuck may or may not contact a die. Different design considerations may be used for the array of bonding heads 124 as compared to array of pick-up heads 144. Between the array of pick-up heads 144 and the array of bonding heads 124, the bonding heads can have the same design or a different design as compared to the pick-up heads.

Similar to the array of pick-up heads 144, the array of bonding heads 124 can be configured as a vector (a row or a column of bonding heads 124) or as a matrix (at least two rows and at least two columns of bonding heads 124). Regarding the matrix, the number of bonding heads within the array of bonding heads 124 may be different between rows, between columns, or between rows and columns. Some array configurations can be 3×1, 6×1, 2×2, 2×3, 10×10, or another rectangular shape, where the first number corresponds to the number of bonding heads along a row or column, and the second number corresponds to the number of bonding heads along the other of the row or column. In theory, dies from an entire wafer could be transferred all at once. For such a configuration, the array of bonding heads 124 may have fewer bonding heads along rows closer to the top and bottom of the array as compared to the row closest to the center of the array, and the array of bonding heads 124 may have fewer bonding heads along columns closer to the left-hand side and right-hand side of the array as compared to the column closest to the center of the array. After reading this specification, skilled artisans will be able to determine an array configuration for the array of bonding heads 124 that meets the needs or desires for a particular application. In an embodiment, the array of bonding heads 124 has the same number of rows and columns as compared to the array of pick-up heads 144.

Bodies for the array of bonding heads 124 can be coupled to the bridge 120 and arranged to have a bonding head pitch. The bonding heads may be configured such that the die chucks have a limited range of motion relative to their corresponding bodies to provide better positioning when dies are transferred from the array of bonding heads 124 to a destination substrate when coupled to the destination chuck 148.

The bonding head pitch for the array of bonding heads 124 should be the same as the destination pitch that can be the pitch for destination bonding sites on the destination substrate. Alternatively, the destination pitch can be the pitch for die locations of the destination substrate where dies will be bonded to the destination substrate. In practice, the bonding head pitch is usually different from the destination pitch. A successful chip transfer can occur when the difference between the bonding head pitch and the destination pitch is within an acceptable tolerance.

The maximum allowable tolerance for the difference between the bonding head pitch for the array of bonding heads 124 and the destination pitch for the destination substrate is less than the maximum allowable tolerance for the difference between the bonding head pitch for the array of bonding heads 124 and the bonding head-matching pitch for the array of pick-up heads 144. Thus, the bodies of the bonding heads within the array of bonding heads 124 need to be more accurately and precisely placed as compared to the pick-up heads within the array of pick-up heads 144. The positions for the bodies of the bonding heads within the array of bonding heads 124 are typically not changed during a transfer operation.

The destination chuck 148 can be coupled to the destination carriage 146 and has a chucking surface facing the bridge 120 or a component coupled to the bridge 120. In an embodiment, the destination chuck 148 is attached to the destination carriage 146. The destination chuck 148 can hold a destination substrate having destination bonding sites. The destination chuck 148 can be a vacuum chuck, pin-type chuck, a groove-type chuck, an electrostatic chuck, an electromagnetic chuck, or the like. The destination chuck 148 can be heated, cooled, or both heated and cooled. The destination chuck 148 can include a heater. In the same or different embodiment, a fluid (not illustrated) can flow through the destination chuck 148 to increase or decrease the temperature of the destination chuck 148.

Alignment hardware 150 is coupled to the destination carriage 146, and the reference 126 is coupled to the bridge 120 and includes one or more alignment marks. The alignment hardware 150 can include an optical component and provide information to the controller 160 or a local controller located within the alignment hardware 150, the destination carriage 146, the base 140, or a combination thereof. The alignment hardware 150 can be used to align the destination carriage 146 to the one or more alignment marks of the reference 126, align the destination carriage 146 to bonding heads within the array of bonding heads 124, or both.

Registration hardware 127 is coupled to the bridge 120, and other registration hardware 147 is coupled to the pick-up head carriage 142, respectively. The registration hardware 127 and 147 can include an optical component and provide information to the controller 160 or a local controller located within the registration hardware 127 or 147, the bridge 120, the pick-up head carriage 142, the base 140, or a combination thereof. A source substrate, dies attached to the source substrate, a destination substrate, destination bonding sites or die locations for the destination substrate or any combination of the four can be registered in their respective stage coordinates before dies are transferred from the source substrate to the destination substrate. The information from the registration hardware 147 can be used to determine a source pitch for a plurality of dies for a source substrate. Further, the information may be used to identify or confirm the plurality of dies are the correct dies being transferred. The information from the registration hardware 127 can be used to determine a destination pitch for destination bonding sites or die locations of a destination substrate. Further, the information may be used to identify or confirm the destination substrate is the correct substrate to which dies will be transferred.

The apparatus 100 can be controlled by a controller 160 in communication with the bridge 120, any component coupled to the bridge 120, the base 140, any component coupled to the base 140, or a combination thereof. The controller 160 can operate on a computer readable program, optionally stored in memory 162. The controller 160 can include a processor (for example, a central processing unit of a microprocessor or microcontroller), a field-programmable gate array (FPGA), an application specific integrated circuit (ASIC), or the like. The controller 160 can be within the apparatus 100. In another implementation (not illustrated), the controller 160 can be at least part of a computer external to the apparatus 100, where such computer is bidirectionally coupled to the apparatus 100. The memory 162 can include a non-transitory computer readable medium that includes instructions to carry out the actions associated with the transfer operation. In another embodiment, the bridge 120, a component coupled to the bridge 120, the base 140, or a component coupled to the base 140 can include a local controller that provides some of the functionality that would otherwise be provided by the controller 160.

When transferring a set of dies, care may be exercised to reduce the likelihood of contamination or damage of a surface of a die. Hybrid bonding can involve activating a surface, and contacting the activated surface should be avoided or reduced as to not adversely affect the activated surface. For other electrical connections, a particle or other contaminant may be along a surface of a die transfer head may be transferred to a die. A non-contact die transfer head can reduce the likelihood of adverse effects that are more likely to occur with die transfer head that contacts a die being transferred.

Many times, dies are transferred from a source substrate that can be a tape where an adhesive layer contacts all or nearly all of surfaces of the dies or die structures that include the dies, where the surfaces face the tape. For example, a die substrate can be attached to a dicing tape, and the die substrate can be singulated into dies. As used herein, an original die pitch for the dies is the die pitch for a die substrate after singulating the die substrate and before removing a die from the die substrate. A non-contact die chuck may generate less force to separate a die from the tape as compared to using a die chuck that contacts a die or a die structure that includes the die. Further, the non-contact die chuck head may rely on gas flows and areas of lower pressure around surfaces of the die to generate force sufficient to separate the die or die structure from the tape. Thus, removing the die or die structure using a non-contact die chuck can be substantially more challenging than removing the die using a die chuck that contacts the die.

The issues with a non-contact die chuck may be eliminated or substantially reduced by reducing the amount of contact area between the adhesive and the dies or die structures to be transferred. A tape can have a patterned adhesive layer, or a tape can have a shape or be deformed into a shape that has reduced contact area between an adhesive layer and the dies or die structures. In many embodiments described below, a substrate chuck can have a chucking surface with a pattern that allows a substrate to be deformed by pulling a portion of the substrate away from the dies or die structures.

The apparatus 100 can be configured with some or all of the components in a different configuration. For example, all components that are illustrated in FIG. 1 as being coupled to the bridge 120 may be coupled to the base 140, and all components that are illustrated in FIG. 1 as being coupled to the base 140 can be coupled to the bridge 120. In another configuration, the source chuck 122 can be coupled to the base 140 with or without a carriage coupled between the source chuck 122 and the base 140, the array of bonding heads 124 can be coupled to the base 140 with or without a carriage coupled between the array of bonding heads 124 and the base 140, the array of pick-up heads 144 can be coupled to a carriage coupled to the bridge 120 with or without the pick-up head carriage 142 coupled between the array of pick-up heads 144 and the bridge 120, the destination chuck 148 can be coupled to the base 140 with or without the destination carriage 146 coupled between the source chuck 122 and the base 140, or a combination thereof. In the same or different configuration, the reference 126, the registration hardware 127, and the registration hardware 147 can be coupled to the bridge 120 or the base 140 as illustrated in FIG. 1. In another embodiment for the same or different configuration, the reference 126 can be coupled to the base 140, the registration hardware 127 can be coupled to the base 140, the registration hardware 147 can be coupled to the bridge 120, or any combination thereof.

Attention is directed to methods of using the apparatus 100 when transferring a set of dies or die structures from a source substrate and bonding the set of dies to destination bonding sites on a destination substrate. The methods described in more detail below can be used for dies and die structures. Die structures may include a thin die, a backing plate, and an adhesive layer between the thin die and the backing plate. For simplicity, the methods are described with respect to dies. The methods can also be used for die structures although much of the description below focuses on dies.

Figure 8:
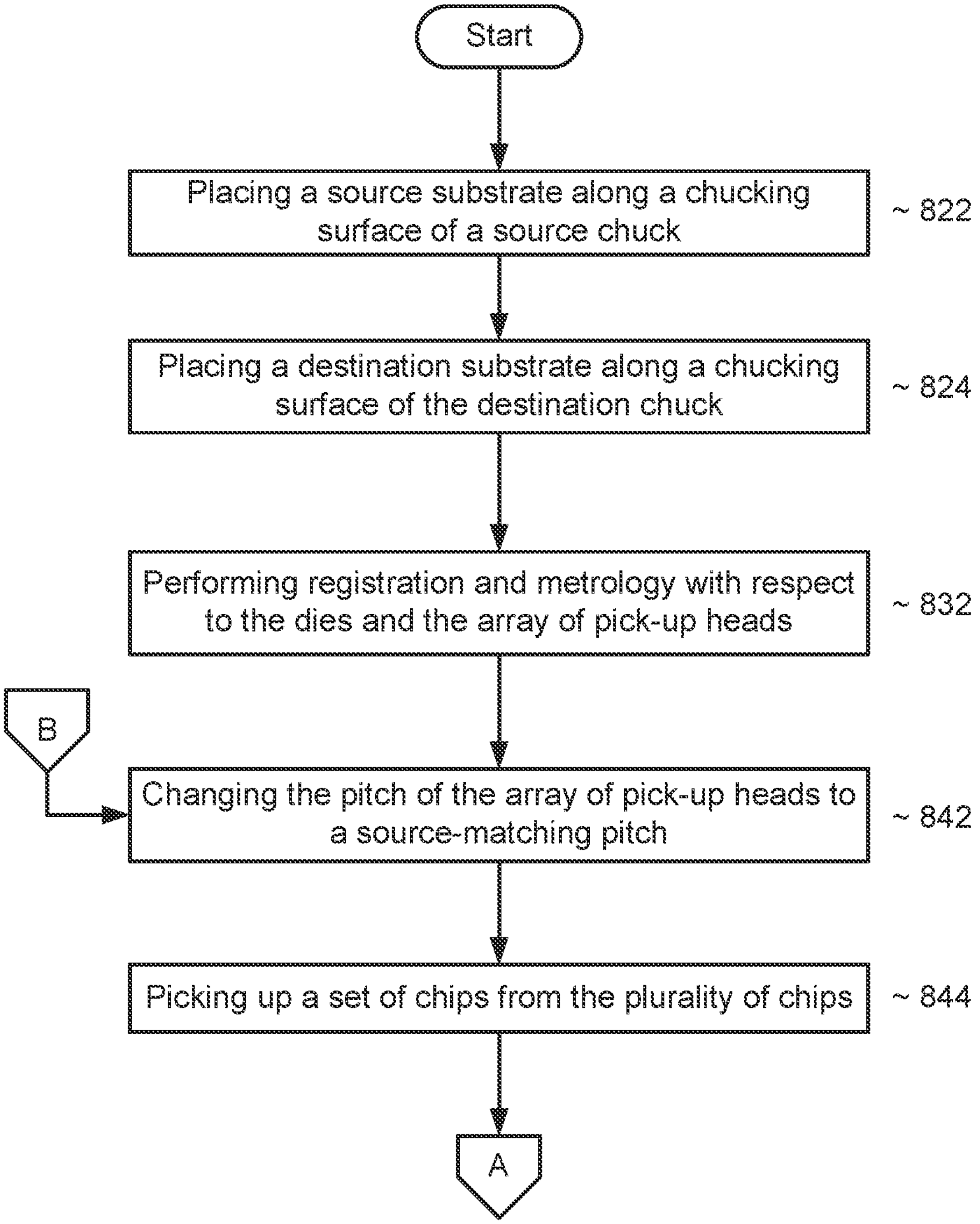
FIGS. 8 and 9 include a process flow diagram for a method of transferring and bonding dies to destination bonding sites of a destination substrate.
Figure 9:
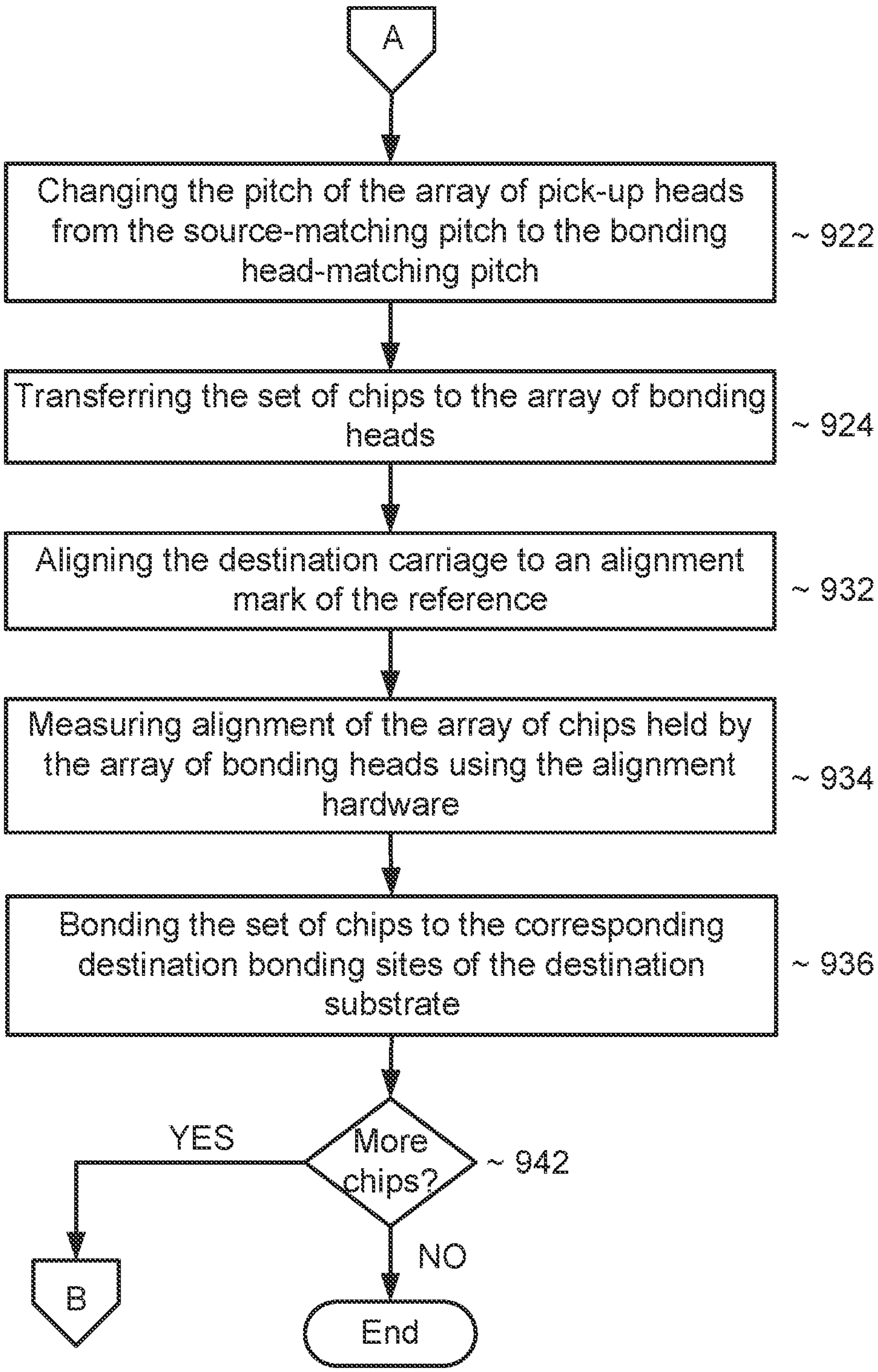

FIGS. 8 and 9 include a process flow diagram of a method that is described with respect to FIGS. 10, 12 to 16, and 21 to 23. In some of the figures, the space between (1) the bridge 120 and components coupled to the bridge 120 and (2) the base 140 and components coupled to the base 140 is greatly exaggerated to allow reference numbers and corresponding lead lines to be seen more readily. In practice, the bridge 120 and base 140 may be significantly closer to each other than as illustrated.

Before starting the method, the dies and the destination substrate can be prepared such that the dies, the destination substrate, or both have activated surfaces to aid in bonding. After cleaning, a surface can be activated by exposing the surface to a plasma treatment and deionized water rinse to hydrate the surface. Where reasonably practical, contact with an activated surface should be avoided. In the figures, activated surfaces of the dies and the destination substrate are illustrated with shaded bands along their bonding surfaces.

Figure 10:
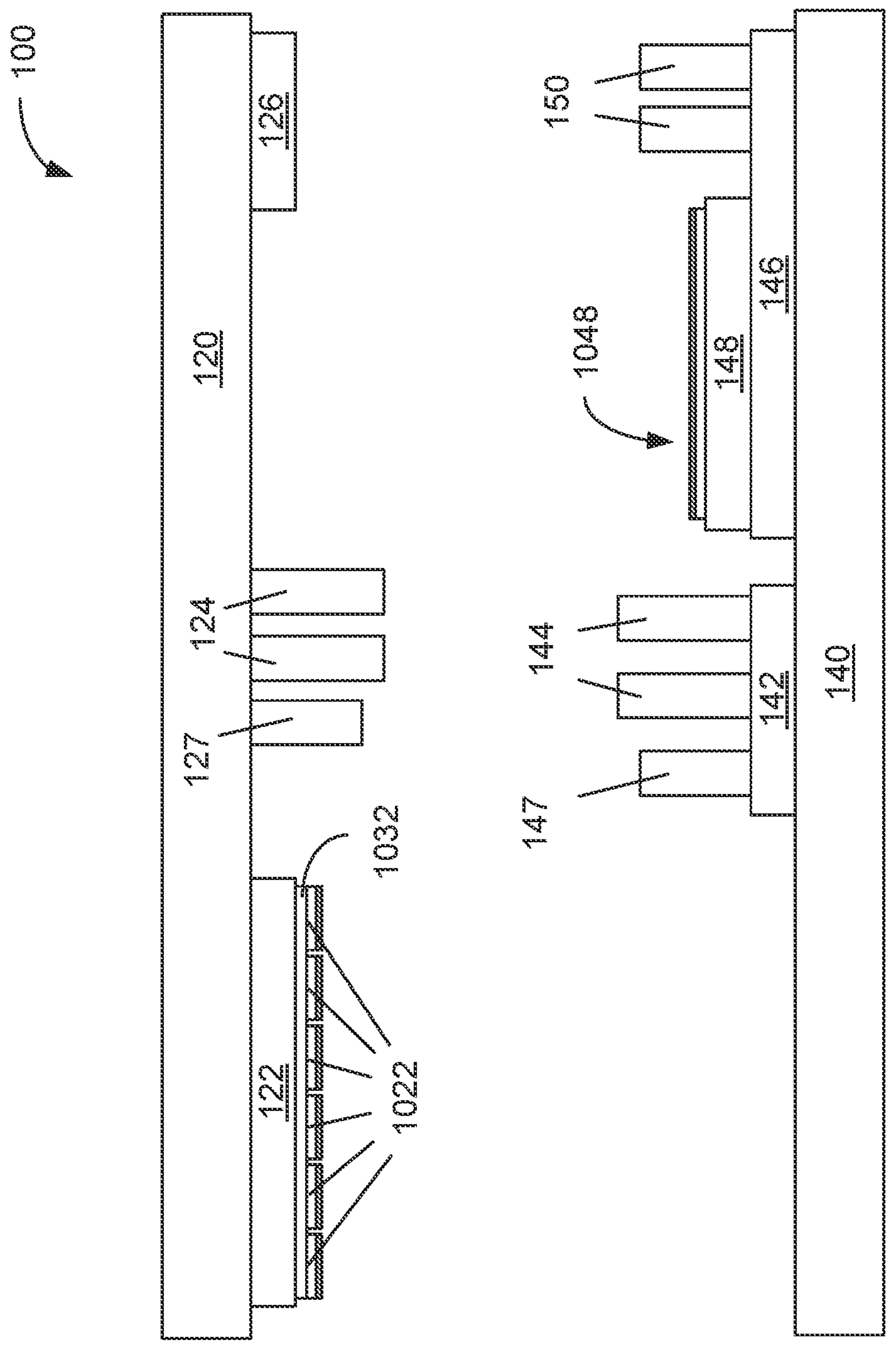
FIG. 10 includes an illustration of a cross-sectional view of the apparatus of FIG. 1 after loading a source substrate and a destination substrate into the apparatus.

The method can include placing a source substrate along a chucking surface of a source chuck at block 822 in FIG. 8. As illustrated in FIG. 10, the pick-up head carriage 142 may be moved to allow easier access to the source chuck 122. Dies 1022 can be associated with the source substrate 1032. For many embodiments described and illustrated herein, the dies 1022 can be attached to a source substrate 1032, and the dies 1022 are subsequently removed from the source substrate 1032. In some figures, source substrates 1032*a* and 1032*b* are specific examples of the source substrate 1032. All or some of the dies 1022 will be transferred from the source substrate 1032 to a destination substrate 1048. The dies 1022 can have bonding surfaces that face the base 140 or a component coupled to the base 140.

At least one of dies 1022 can include a microprocessor, a microcontroller, a graphic processing unit, a digital signal processor, a memory chip (for example, a Level 2 or Level 3 cache, a flash memory, or the like), a power transistor chip, a power circuit chip, or the like. The die has a device side, which has most or all of the electrical circuit elements of the chip, and a back side opposite the device side. In the embodiment as illustrated in FIG. 10, the back sides of the dies 1022 are disposed between the source chuck 122 and the device sides of the dies 1022. In another embodiment, the device side of the dies 1022 are disposed between the source chuck 122 and the back sides of the dies. The sides of the dies facing the base 140 are activated for hybrid bonding to the destination substrate 1048.

Figure 11:
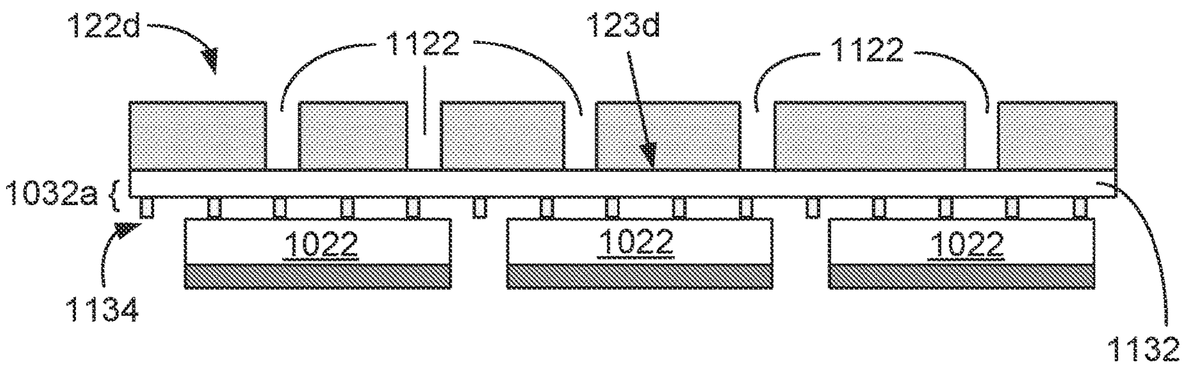
FIG. 11 includes a cross-sectional view of portions of the source chuck, a source substrate, and dies, where the source substrate includes a patterned adhesive layer.
Figure 12:
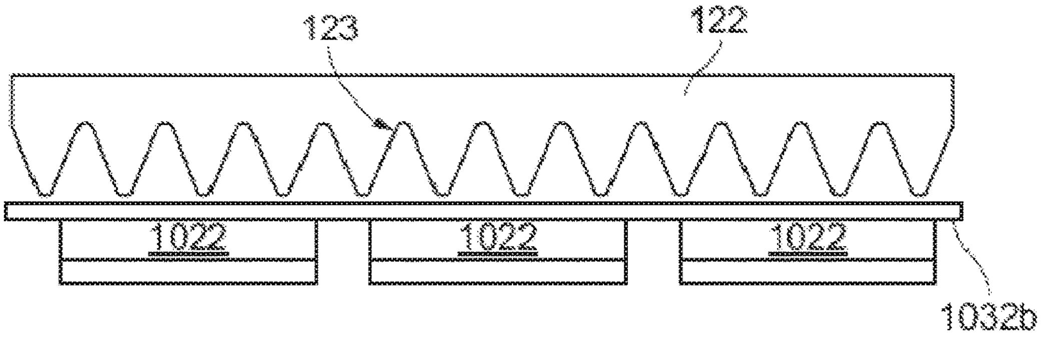
FIG. 12 includes a cross-sectional view of portions of the source chuck, the source substrate, and dies before deforming the source substrate.
Figure 13:
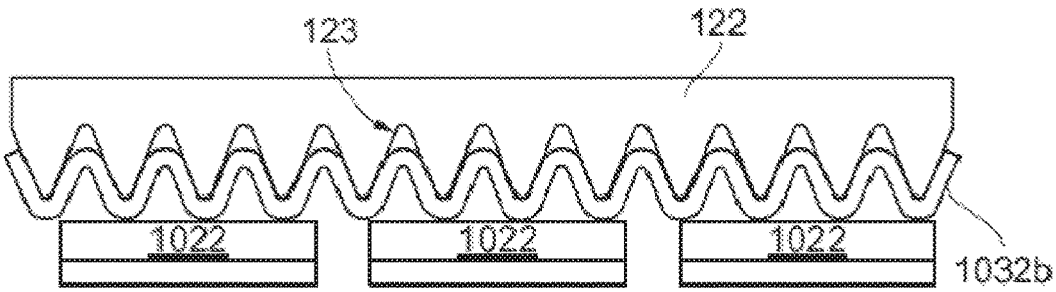
FIG. 13 includes a cross-sectional view of portions of the source chuck, the source substrate, and the dies of FIG. 12 after deforming the source substrate.

The source substrate 1032 can be a tape that may be in the form of a tape frame or tape reel. The tape can include a backing sheet and an adhesive layer, and the dies 1022 contact the adhesive layer. The tape can be designed as illustrated in FIG. 11 or be deformed as illustrated in FIGS. 12 to 13 to allow gas to flow better along the back side of the dies. The improved gas flow allows the dies 1022 to be picked up more readily by a non-contact die chuck.

FIG. 11 includes portions of a source chuck 122*d*, vacuum ports 1122, the source substrate 1032*a*, and the plurality of dies 1022. In an embodiment, the source substrate 1032*a* can include the backing sheet 1132 and a patterned adhesive layer 1134, where the backing sheet 1132 is in contact with a chucking surface 123*d* of the source chuck 122*d*. For the source substrate 1032*a* illustrated in FIG. 11, the source chuck 122*d* can have a chucking surface that is planar. The patterned adhesive layer 1134 contacts part, and not all, of back sides of the dies 1022. The patterned adhesive layer 1134 allows gas to flow between the back sides of the dies 1022 and the backing sheet 1132 along gaps within the patterned adhesive layer 1134. The gaps correspond to gas channels where gas can flow under the dies 1022.

For the dies illustrated in FIG. 11, the patterned adhesive layer 1134 can contact at least 1% of the area along the back sides of the dies. If the pattern adhesive layer 1134 contacts less than 1%, the dies 1022 may move too much during handling the source substrate 1032*a*, when transferring other dies attached to the source substrate 1032*a*, or a combination thereof. The patterned adhesive layer 1134 can contact at most 20% of the area along the back sides of the dies. As the amount of contact area increases, more force will be needed to remove the dies 1022. In an embodiment, the contact area along the back sides of the dies can be in a range from 1% to 20%, 3% to 20%, or 5% to 18%. The amount of contact area can be affected by how strongly the patterned adhesive layer 1134 adheres to the back sides of the die. Thus, the contact area between the patterned adhesive layer 1134 and the back sides of the dies 1022 may be less than 1% or greater than 20% in some embodiments.

The patterned adhesive layer 1134 contacts the back sides of the dies at a plurality of locations. Thus, the feature pitch for the patterned adhesive layer 1134 (sum of the width of an adhesive feature and a width of a gap immediately adjacent to such feature) will be less than the width of a die. The feature pitch for the patterned adhesive layer 1134 can be in a range from 0.5 mm to 2.0 mm. Chiplets can be very small die, and very large die can be microprocessors or graphic processing units. The feature pitch for the patterned adhesive layer 1134 may be smaller than 0.5 mm with very small die sizes and greater than 2.0 mm for very large die sizes.

The thickness (Z-direction dimension) of the patterned adhesive layer 1134 corresponds to the height of the gas channels between the backing sheet 1132 and the back sides of the dies. The patterned adhesive layer 1134 can have a thickness in a range from 25 microns to 200 microns. The patterned adhesive layer 1134 can have a thickness outside the range if needed or desired to obtain gas flow characteristics for the gas channels between the backing sheet 1132 and the back sides of the dies 1022.

FIGS. 12 and 13 illustrate how a source substrate can be deformed so that the source substrate contacts spaced-apart portions of the dies, and the source substrate does not contact other portions of the same dies between the spaced-apart portions of the source substrate. Gas channels are defined at least in part by the other portions of the same dies between the spaced-apart portions of the source substrate that contact the dies.

FIG. 12 includes portions of the source chuck 122, the chucking surface 123, a source substrate 1032*b*, and dies within the plurality of dies 1022. The source chuck 122 and the chucking surface 123 can have any of the designs described herein with respect to substrate chucks having non-planar chucking surfaces. The source chuck 122 has vacuum ports; however, the vacuum ports are not illustrated to simplify understanding of the concepts described herein. The pitch of the features along the chucking surface 123 can be any of the values as previously described with respect to the patterned adhesive layer 1134. The elevational differences between tops and bottoms of the concentric rings can have any of the values as previously described with respect to the thickness of the patterned adhesive layer 1134.

The source substrate 1032*b* can include a tape having any of the materials and construction as the tape for the source substrate 1032*a* except that the tape for the source substrate 1032*b* has an unpatterned adhesive layer. The tape has a backing sheet and the unpatterned adhesive layer. In FIGS. 12 and 13, the backing sheet and unpatterned adhesive layer are not separately illustrated.

FIG. 12 illustrates the source substrate 1032*b* and dies within the plurality of dies 1022 when the source substrate 1032*b* is positioned at or near the chucking surface 123 of the source chuck 122. All or substantially all of the back sides of the dies 1022 can contact the unpatterned adhesive layer before the source substrate 1032*b* is deformed. Referring to FIGS. 3 and 13, the controller 160 or a local controller can transmit a signal to activate the actuator 349 to place the vacuum manifold 346 and vacuum ports 344 under vacuum. The vacuum is strong enough to cause portions of the source substrate 1032*b* to deform and pull away from portions of the dies 1022. As the source substrate 1032*b* is pulled away from the dies 1022, the contact area between the adhesive layer within the source substrate 1032*b* and the dies 1022 becomes less as illustrated in FIG. 13. The relative amount of contact area can be any of the values previously described with respect to the patterned adhesive layer 1134. The vacuum may be maintained during the transfer operation.

Referring to FIG. 13, gas channels are formed where portions of the source substrate 1032*b* pulled away from the dies 1022. The gas channels provide the same function as previously described with respect to the patterned adhesive layer 1134 and dies 1022 in FIG. 11.

The method can include placing a destination substrate along a chucking surface of the destination chuck at block 824 in FIG. 8. As illustrated in FIG. 10, the destination carriage 146 may be moved to allow easier access to the destination chuck 148. The actions in blocks 822 and 824 can be performed in either order. For example, the source substrate 1032 and associated plurality of dies 1022 can be placed before or after placing the destination substrate 1048.

The destination substrate 1048 can include any of the substrates described with respect to the source substrate and can also include a semiconductor wafer, a package substrate, a printed wiring board, a circuit board, an interposer, or the like. Microelectronic devices may be part of the destination substrate 1048, such as a semiconductor wafer. The package substrate, the printed wiring board, the circuit board, or the interposer may or may not have dies mounted thereto. Part or all of the side of the destination substrate 1048 can be activated for hybrid bonding. The upper surface of the destination substrate 1048 is activated and illustrated with a shaded band.

The actions in blocks 822 and 824 of FIG. 8 can be performed in either order. For example, the source substrate 1032 and associated plurality of dies 1022 can be mounted before or after mounting the destination substrate 1048.

Figure 14:
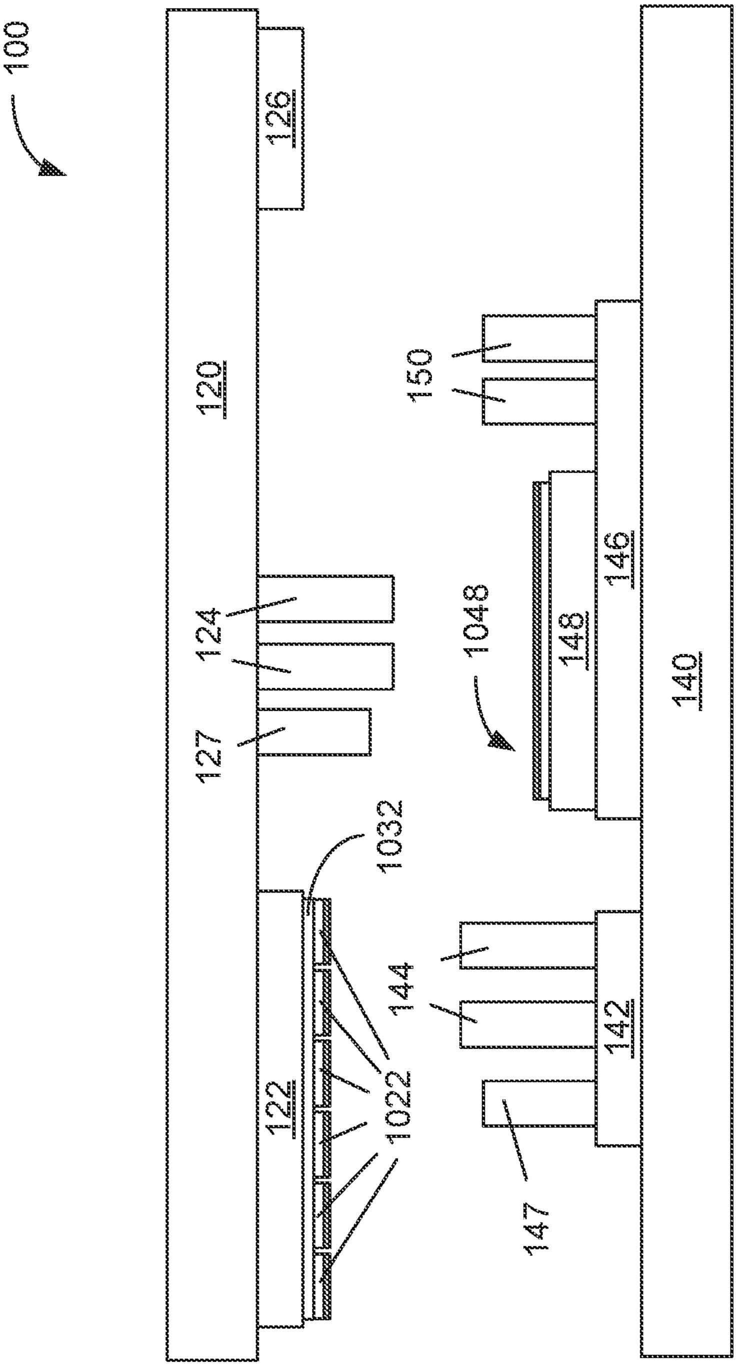
FIG. 14 includes an illustration of a cross-sectional view of the apparatus of FIG. 10 during a registration operation.

The method can include performing registration and metrology with respect to the dies and the array of pick-up heads at block 832 in FIG. 8. FIG. 14 includes a cross-sectional view of the apparatus 100 as the registration hardware 127 and 147 are collecting information. Registration hardware 127 and 147 can perform the functions as previously described. The information from the registration hardware 147 can be transmitted to the controller 160 or a local controller and used to determine the source pitch for the dies 1022. The source pitch can be the original die pitch for the dies 1022 before a die is removed from the source substrate 1032. The information from the registration hardware 127 can be transmitted to the controller 160 or a local controller and used to determine the destination pitch for the destination bonding sites of the destination substrate 1048 and locations of the destination bonding sites. If needed or desired, the information may be used to identify or confirm the dies 1022 and the destination substrate 1048 are correct for the transfer operation.

The method can further include changing the pitch of the array of pick-up heads to a source-matching pitch at block 842 in FIG. 8. In FIG. 14, the array of pick-up heads 144 are adjusted to have a source-matching pitch. The source-matching pitch can be the same or within an allowable tolerance of the source pitch.

Figure 15:
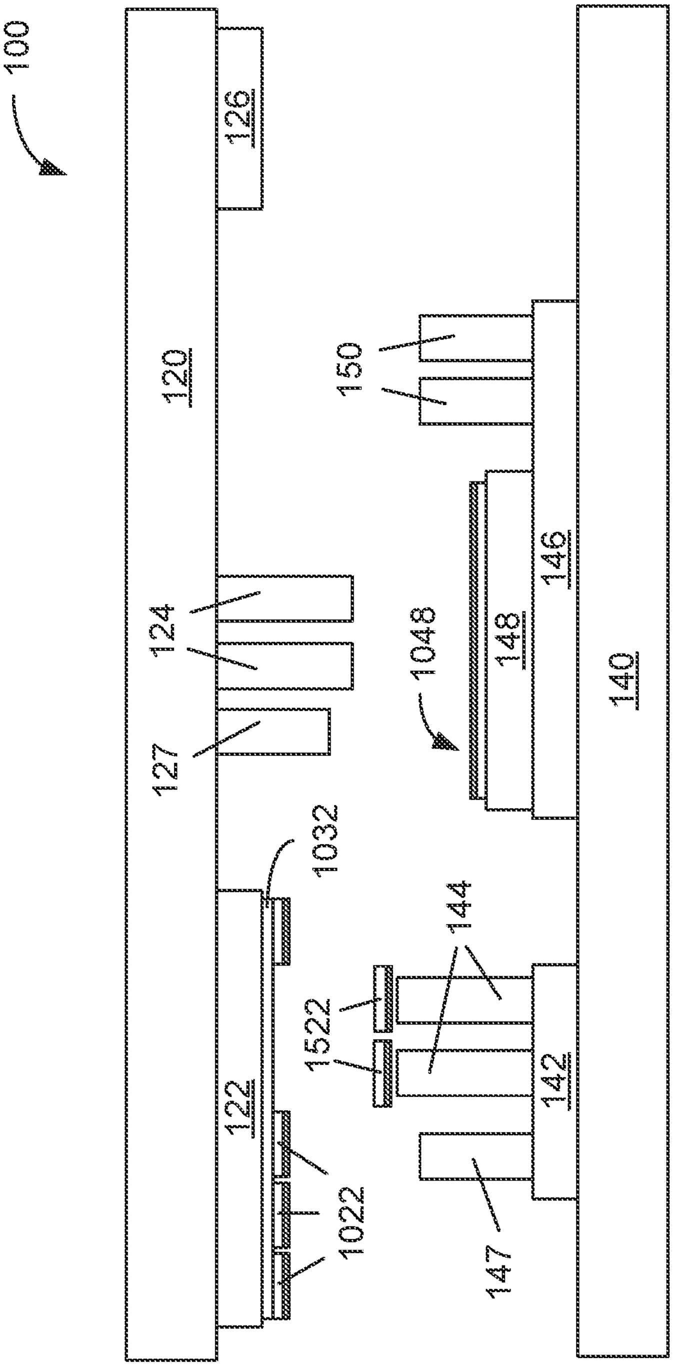
FIG. 15 includes an illustration of a cross-sectional view of the apparatus of FIG. 14 after an array of pick-up heads picked up a set of dies from a source substrate.

The method can include picking up a set of dies from the plurality of dies at block 844 in FIG. 8. The array of pick-up heads 144 can be extended in the Z-direction and pick up the dies 1522 as illustrated in FIG. 15. The set of dies for the transfer cycle include the dies 1522. In an embodiment, the array of pick-up heads 144 do not contact the activated surfaces of the dies 1522. The pick-up heads 144 can include non-contact pick-up chucks. Gas flow around the dies 1522 can help with picking up dies more readily as compared to where all of the back sides of the dies are in contact with an adhesive material.

Figure 16:
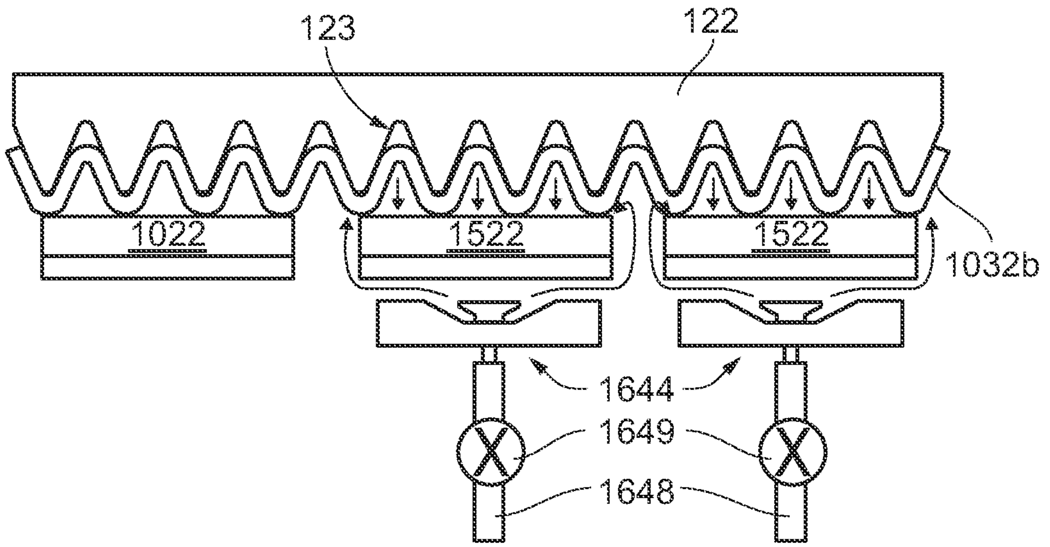
FIG. 16 includes an illustration of a cross-sectional view of portions of the source chuck, the source substrate, the array of pick-up heads, and the dies where the die chucks include Bernoulli chucks.
Figure 17:
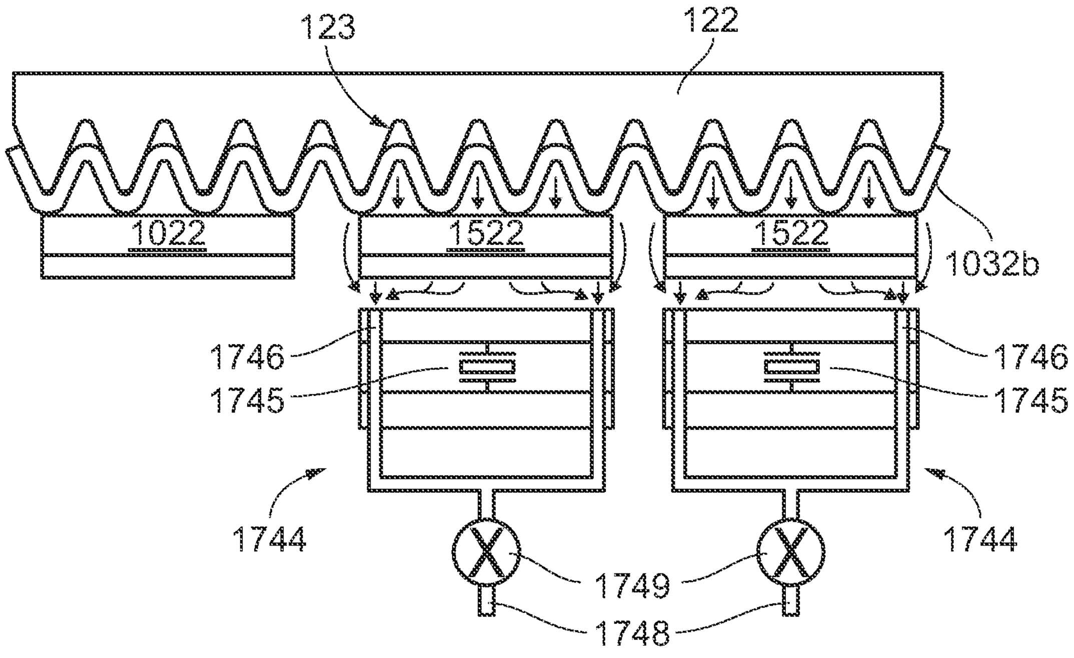
FIG. 17 includes an illustration of a cross-sectional view of portions of the source chuck, the source substrate, the array of pick-up heads, and the dies where the source chucks include vacuum ports and piezoelectric transducers.
Figure 18:
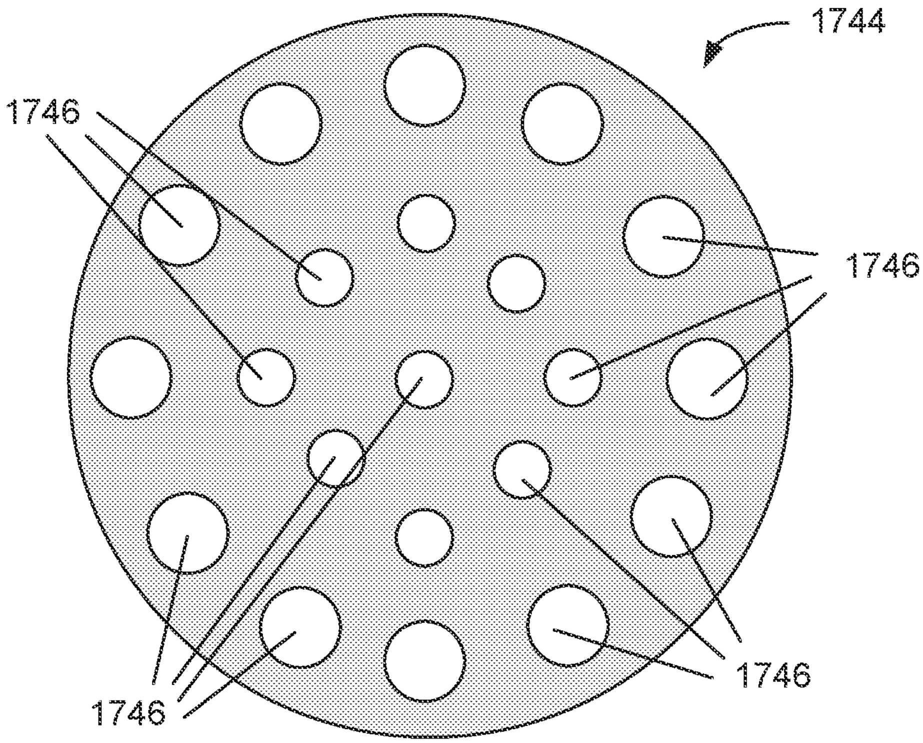
FIG. 18 includes an illustration of a top view of one of the die chucks of FIG. 17.
Figure 19:
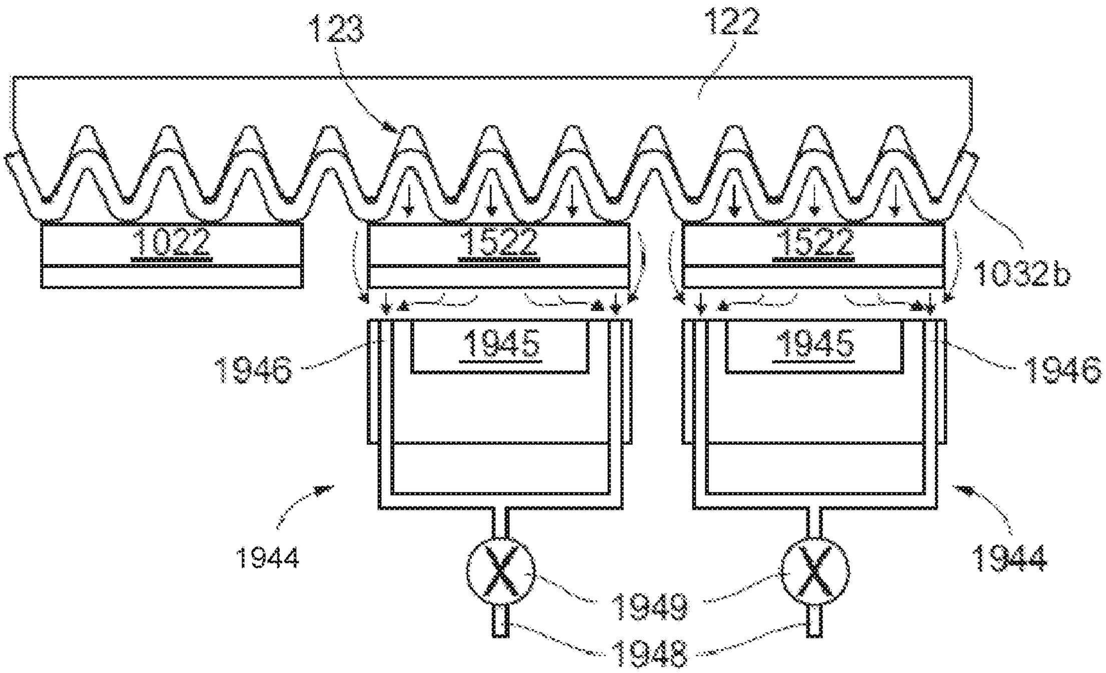
FIG. 19 includes an illustration of a cross-sectional view of portions of the source chuck, the source substrate, the array of pick-up heads, and the dies where the die chucks include vacuum ports and pressurization chambers.

FIGS. 16 to 20 include some designs that can be used as part of non-contact pick-up chucks that can be used within the array of pick-up heads 144. The non-contact pick-up chucks can include or be part of a die retention module that can be used to hold die using the array of pick-up heads 144. The non-contact die chucks 1644, 1744, and 1944 correspond to particular designs that can be used within the array of pick-up heads 144. The figures are meant to be illustrative and not limiting to the present invention as defined in the appended claims. In FIGS. 16, 17, and 19, the die 1022 is not being transferred during the current transfer cycle. The source chuck 122 and the chucking surface 123 can have any of the designs described herein with respect to source chucks having non-planar chucking surfaces. The source chuck 122 has vacuum ports; however, the vacuum ports are not illustrated in FIGS. 16, 17, and 19 to simplify understanding of the concepts described herein. Gas flows near the dies 1522 are illustrated with arrows in FIGS. 16, 17, and 19.

FIG. 16 includes a cross-sectional view of portions of the array of pick-up heads, the dies 1522, the source substrate 1032*b* that can be in the form of a tape, and the source chuck 122 having a non-planar chucking surface 123. The array of pick-up heads include non-contact die chucks 1644 that include Bernoulli chucks. When picking up the dies 1522, the controller 160 or a local controller transmits a signal to activate a pressure actuator 1649 to allow gas from a pressure source through the gas line 1648 to flow along the surface of the dies 1522. The gas flow is illustrated with arrows. Gas flows along the periphery of the dies 1522 and along the vertical sides of the dies 1522 where the vertical sides are between the device sides and back sides of the dies 1522. The pressure actuator 1649 can be a valve, a regulator, or the like. The pressure source may include a gas cylinder, a gas storage tank, a compressor, or the like, and the gas can be air, $N_2$, Ar, or the like. As compared to a device side of the die 1522, gas flow along the back side of the dies 1522 allows a locally lower pressure region to form along the back side of the die. The relatively lower pressure generates a force that is sufficient to overcome the adhesive force of the adhesive layer of the source substrate 1032*b*, the dies 1522 can be removed from source substrate 1032*b*.

As illustrated in FIG. 16, the source substrate 1032*b* contacts spaced-apart portions of the dies 1522, and the source substrate 1032*b* does not contact other portions of dies 1522 between the spaced-apart portions of the source substrate 1032*b*. Gas can flow between the spaced-apart portions of the source substrate 1032*b* and the die 1522. Such spaced-apart portions can be at or near the centers of the back sides of the dies 1522. Thus, the combination of the source chuck 122 with the non-planar chucking surface 123 and the source substrate 1032*b* allows for better gas flow along the back sides of the dies 1522.

FIG. 17 includes a cross-sectional view of portions of the array of pick-up heads, the set of dies 1522, the source substrate 1032*b* that can be in the form of a tape, and the source chuck 122 having a non-planar chucking surface 123. The array of pick-up heads 144 include non-contact die chucks 1744 that include piezoelectric transducers 1745 and vacuum ports 1746. FIG. 18 includes a top view of one of the non-contact pick-up chucks 1744. The vacuum ports 1746 can be coupled to a vacuum line 1748 that can be coupled to a vacuum source within or outside of the apparatus 100. A vacuum actuator 1749 can allow vacuum from the vacuum source to reach the vacuum ports 1746. The vacuum actuator 1749 can be a valve, a regulator, or the like.

When picking up the dies 1522, the controller 160 or a local controller transmits a signal to activate the vacuum actuator 1749 to allow a vacuum to be drawn along the surface of the dies 1522. Air or another gas flows through the vacuum ports 1746 and the vacuum line 1748 to the vacuum source. The gas flow is illustrated with arrows. The vacuum generates a force sufficient to overcome the adhesive force of the source substrate 1032*b*.

The controller 160 or a local controller can also transmit a signal to activate the piezoelectric transducers 1745. The piezoelectric transducers 1745 can generate a periodic air compression effect near the surface of the non-contact die chucks 1744 to provide a repulsive force that helps to keep a particular die 1522 from contacting its corresponding non-contact die chuck 1744. The piezoelectric transducer 1745 within a non-contact die chuck 1744 can include two piezoelectric members that can be controlled by an amplitude and frequency of an alternating voltage to the piezoelectric members. A computer simulation or empirical data can be obtained to determine the amplitude and frequency for the alternating voltages to be used for the piezoelectrical members for (1) different distances between and a particular die and its corresponding non-contacting die chuck 1744 and (2) a particular set of forces associated with a vacuum pressure and the gravitational force associated with the particular die. If needed or desired, a table of values for the parameters may be generated and stored in the memory 162 (FIG. 1) for use by the controller 160 or a local controller. When picking up a die, the piezoelectric transducers 1745 may be activated at the same time or before the vacuum actuator 1749 is activated to substantially prevent the dies 1522 from contacting the non-contact die chucks 1744.

As illustrated in FIG. 17, the source substrate 1032*b* contacts spaced-apart portions of the dies 1522, and the source substrate 1032*b* does not contact other portions of die 1522 between the spaced-apart portions of the source substrate 1032*b*. The reduced contact area between the dies 1522 and the adhesive layer of the source substrate 1032*b* allows for less vacuum force to be used when picking up the dies 1522.

Figure 20:
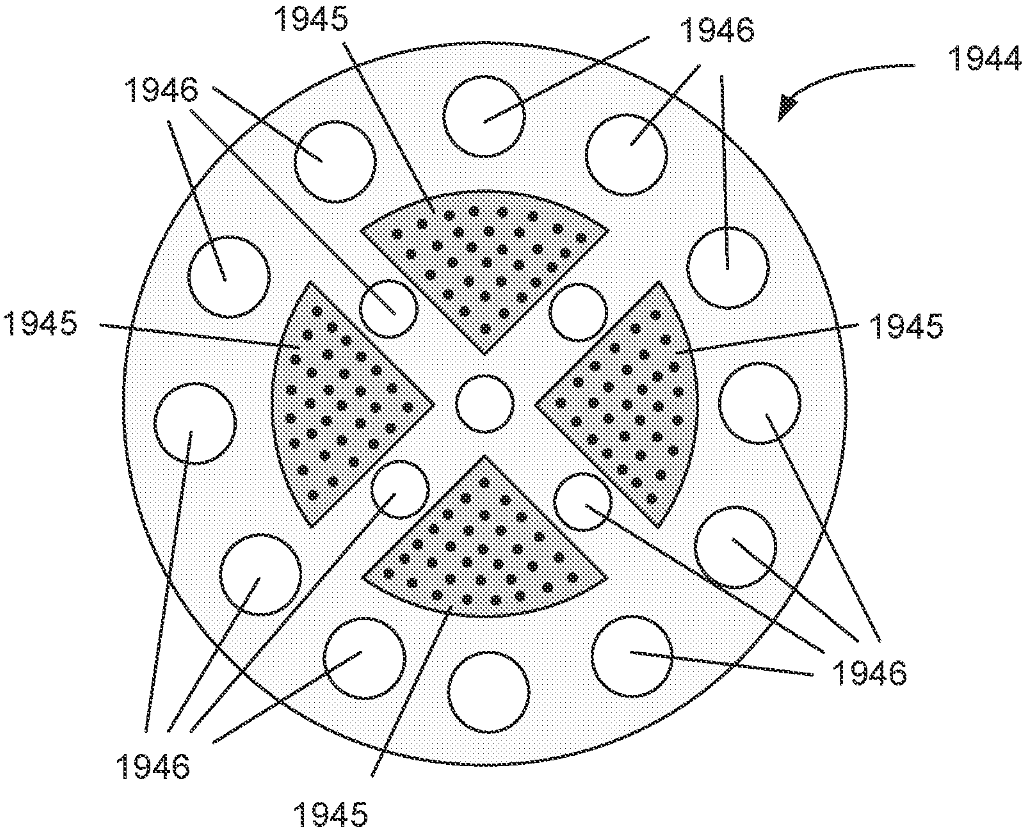
FIG. 20 includes an illustration of a top view of one of the die chucks of FIG. 19.

FIG. 19 includes a cross-sectional view of portions of the array of pick-up heads, the set of dies 1522, the source substrate 1032*b* that can be in the form of a tape, and the source chuck 122 having a non-planar chucking surface. The array of pick-up heads include non-contact die chucks 1944 that include a pressurization chamber 1945 and vacuum ports 1946. FIG. 20 includes a top view of one of the non-contact die chucks 1944. The vacuum ports 1946 can be coupled to a vacuum line 1948 that can be coupled to a vacuum source within or outside of the apparatus 100. A vacuum actuator 1949 can allow vacuum from the vacuum source to reach the vacuum ports 1946. The vacuum actuator 1949 can be a valve, a regulator, or the like.

When picking up the dies 1522, the controller 160 or a local controller transmits a signal to activate the vacuum actuator 1949 to allow a vacuum to be drawn along the surface of the dies 1522. Air or another gas flows through the vacuum ports 1946 and the vacuum line 1948 to the vacuum source. The gas flow is illustrated with arrows. The vacuum generates a force sufficient to overcome the adhesive force of the source substrate 1032*b*.

The controller 160 or a local controller can also transmit a signal to provide a gas from the pressurization chamber 1945 that flows through orifices (illustrated with small black dots in FIG. 20) along the top surface of the non-contact die chuck 1944. The gas can include air $N_2$, Ar, or the like. The dies 1522 can move toward the non-contact die chuck 1944 until the gas from the pressurization chamber 1945 makes the forces on opposite sides of the dies 1522 substantially equal.

The diameters for the orifices and the pressures used for the pressurization chamber 1945 are selected such that the volume of gas flowing into the vacuum ports 1946 is much larger than the volume of gas flowing through the orifices when the dies 1522 are being picked up. A computer simulation or empirical data can be obtained to determine the diameters of the orifices and pressures for the pressurization chamber 1945 for (1) different distances between and a particular die and its corresponding non-contacting die chuck 1944 and (2) a particular set of forces associated with a vacuum pressure and the gravitational force associated with the particular die. If needed or desired, a table of values for the parameters may be generated and stored in the memory 162 (FIG. 1) for use by the controller 160 or a local controller. When picking up a die, the gas flow from the pressurization chamber 1945 may be activated at the same time or before the vacuum actuator 1949 is activated to substantially prevent the dies 1522 from contacting the non-contact die chucks 1944.

As illustrated in FIG. 19, the source substrate 1032*b* contacts spaced-apart portions of the dies 1522, and the source substrate 1032*b* does not contact other portions of die 1522 between the spaced-apart portions of the source substrate 1032*b*. The reduced contact area between the dies 1522 and the adhesive layer of the source substrate 1032*b* allows for less vacuum force to be used when picking up the dies 1522.

The non-contact pick-up chucks described herein are not limited to use only with the source chucks 122*a*, 122*b*, 122*c* and the source substrate 1032*b*. Referring to FIG. 11, the source chuck 122*d* having a planar surface and the source substrate 1032*a* that includes the patterned adhesive layer 1134 can be used with the non-contact pick-up chucks 1644, 1744, and 1944. The patterned adhesive layer 1134 of the source substrate 1032*a* contacts spaced-apart portions of the dies 1022, and the patterned adhesive layer 1134 does not contact other portions of dies 1022 between the spaced-apart portions of the source substrate 1032*b*. With respect to a Bernoulli chuck, the gas flow from Bernoulli chuck can flow between the spaced-apart portions of the patterned adhesive layer 1134 and the dies 1022. Such spaced-apart portions can be at or near the centers of the back sides of the dies 1022. Thus, the patterned adhesive layer 1134 of the source substrate 1032*a* allows for better gas flow along the back sides of the dies 1022 as compared to a conventional source chuck and a conventional tape used for a source substrate. Also, the reduced contact area between the back sides of the dies 1522 and the patterned adhesive layer 1134 allow less force to pick up the dies when using any of the non-contact die chucks 1644, 1744, and 1944.

Referring to FIGS. 1, 2, 4, and 6, the source chuck 122, such as any of the source chucks 122*a*, 122*b*, 122*c*, and 122*d*, can have push pins 224. The push pins 224 can be in a retracted state where exposed surfaces of the push pins 224 are at or near an elevation of the chucking surface 123, such as any of the chucking surfaces 123*a*, 123*b*, 123*c*, and 123*d*, or such exposed surfaces are within a body of the source chuck 122. The push pins 224 can be in an extended state where exposed surfaces of the push pins 224 extend beyond the body of the source chuck 122.

The push pins 224 can be used when placing or removing a source substrate 1032*a* or 1032*b* from a source chuck 122. For example, the push pins 224 can be in the extended state, so that the source substrate 1032*a* or 1032*b* can contact the push pins 224 before contacting the chucking surface 123, such as any of the chucking surfaces 123*a*, 123*b*, 123*c*, and 123*d*, or after the source substrate 1032*a* or 1032*b* is removed from the chucking surface 123. The push pins 224 can be in a retracted state when the set of dies 1522 are being picked up by the array of pick-up heads 144. Thus, the push pins 224 may not be used when the set of dies 1522 are being picked up by the array of pick-up heads 144.

In some embodiments, push pins may be used in conjunction with the source chuck 122*a*, 122*b*, or 122*c* (non-planar chucking surface 123*a*, 123*b*, or 123*c*), the source substrate 1032*a* (die substrate having a patterned adhesive layer), or a combination thereof when picking up the set of dies 1522. Issues related to using push pins without the source substrate 1032*a* or the source substrate 1032*b* after deformation (spaced-apart portions of a die not in contact with an adhesive material of a die substrate when picking up the set of dies 1522) are described in more detail later in this specification.

Figure 21:
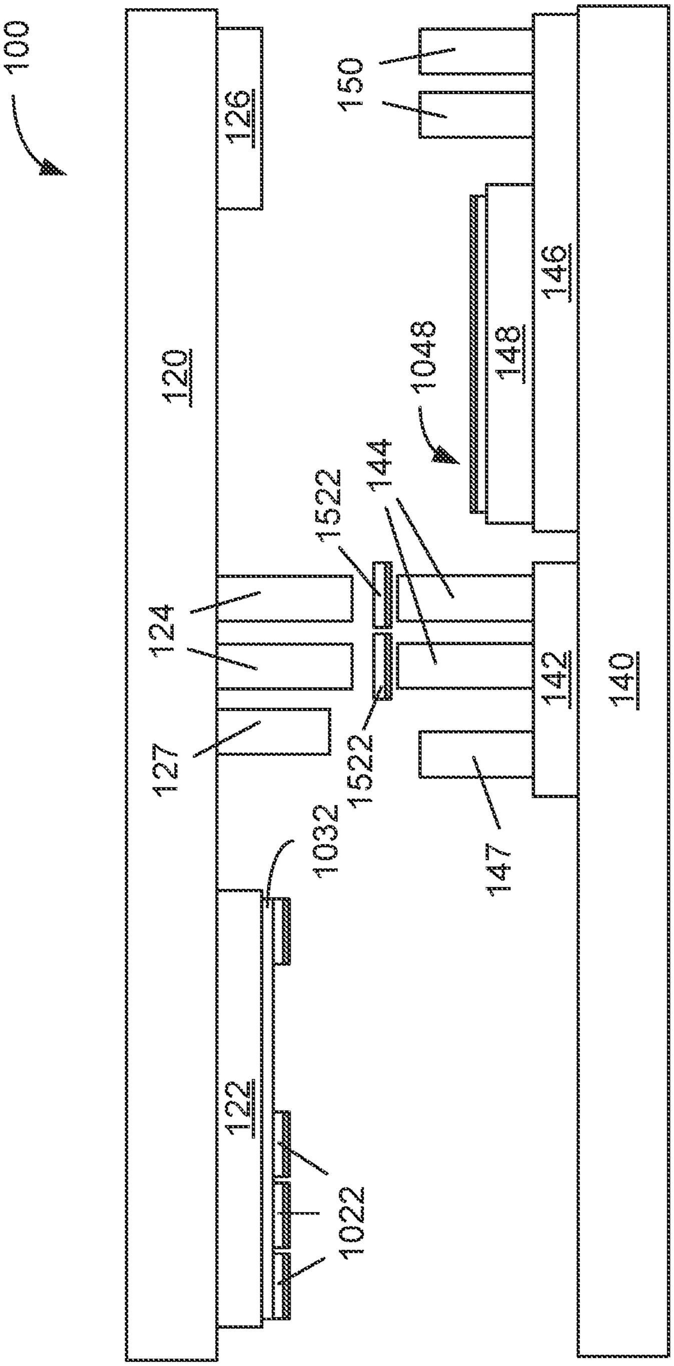
FIG. 21 includes an illustration of a cross-sectional view of the apparatus of FIG. 15 after changing the pitch of the array of pick-up heads.

The method can further include changing the pitch of the array of pick-up heads from the source-matching pitch to the bonding head-matching pitch at block 922 in FIG. 9. Referring to FIG. 21, the pitch for the array of pick-up heads 144 is changed from the source-matching pitch to the bonding head-matching pitch. The dies 1522 are coupled to the array of pick-up heads 144 when the pitch for the array of pick-up heads 144 is changed. The bonding head-matching pitch for the array of pick-up heads 144 can be the same or within an allowable tolerance of the bonding head pitch for the array of bonding heads 124. Depending on the equipment set up of the apparatus, the controller 160 or a local controller can transmit a signal for the pick-up head carriage 142 or the array of pick-up heads 144 to change the pitch from the source-matching pitch to the bonding head-matching pitch.

Figure 22:
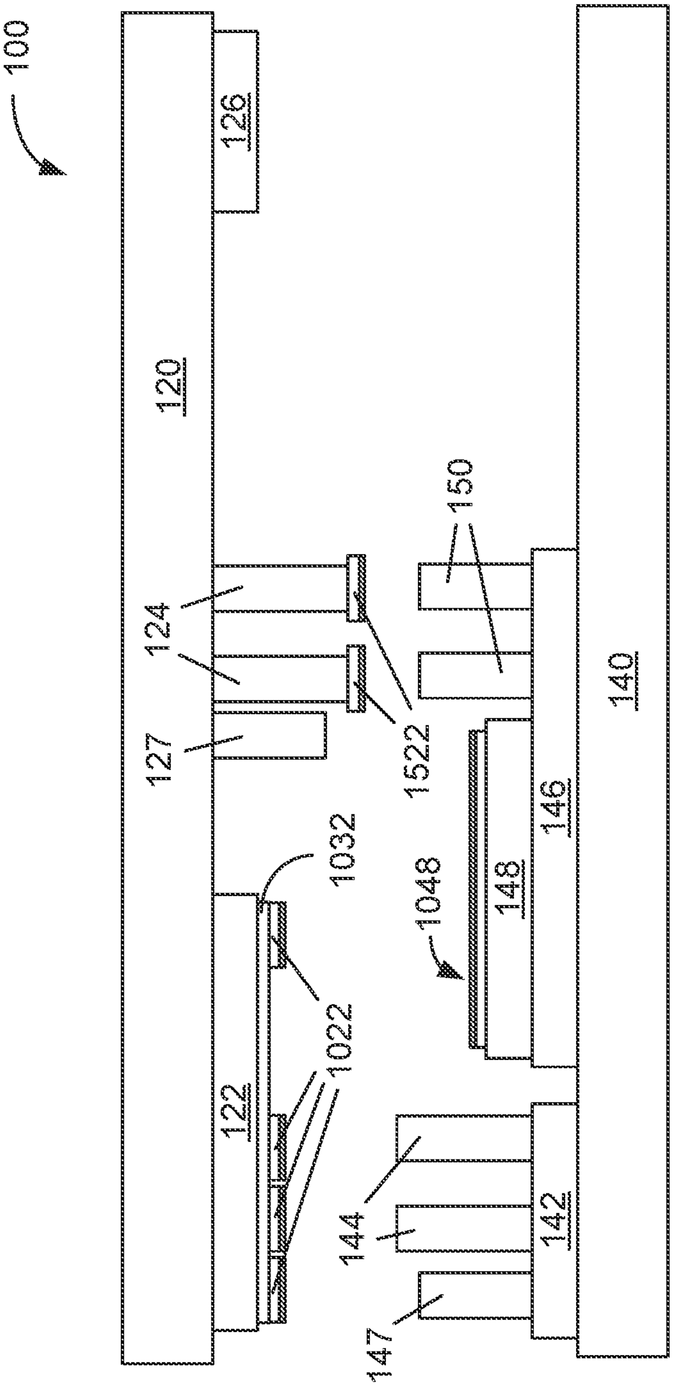
FIG. 22 includes an illustration of a cross-sectional view of the apparatus of FIG. 21 during an alignment measurement operation.

The method can include transferring the set of dies to the array of bonding heads at block 924 in FIG. 9. The pick-up head carriage 142 and destination carriage 146 are moved to the right. The pick-up head carriage 142 is moved so that the array of bonding heads 124 is over the array of pick-up heads 144. If needed or desired, the registration hardware 127, 147, or both can be used to confirm the array of pick-up heads 144 are properly positioned with respect to the array of bonding heads 124. The die chucks within the array of pick-up heads 144 can be extended toward the array of bonding heads 124, the die chucks within the array of bonding heads 124 can be extended toward the array of pick-up heads 144, or both. FIG. 22 includes the dies 1522 after the dies 1522 are transferred from the array of pick-up heads 144 to the array of bonding heads 124. The array of bonding heads 124 can hold the set of dies 1522 along the backsides of the dies or along the sides between the device and back sides of the dies.

The array of bonding heads 124 may be configured to hold dies or die structures by their sides. If a die within the set of dies 1522 is too thin to hold it by its sides between the device side and the back side, a backing plate can be coupled to the die to form a die structure. For example, a die may have a thickness less than 50 microns. A thickness of the die structure is sufficient to allow the bonding head to hold sides of the die structure. The backing plate can have a thickness in a range from 100 microns to 500 microns.

The backing plate can be coupled to the chip using an adhesive compound. The backing plate may be removed at a later time or remain coupled to the chip in the finished electrical device. After the chip is bonded to the destination substrate 1048, the backing plate may be removed. In an embodiment, the adhesive compound may be deactivated by exposure to actinic radiation. The actinic radiation may be in a range from 100 nm to 1000 nm. In such an embodiment, at least 70% of the actinic radiation to be transmitted through the backing plate. In another embodiment, a solvent can be used to remove the adhesive compound from between the chip and the backing plate.

The method can further include aligning the destination carriage to an alignment mark of the reference at block 932 in FIG. 9. The action in block 932 may be performed when performing the action in block 922, block 924, or both blocks 922 and 924. Alternatively, the action in block 932 can be performed at a time different from performing actions in blocks 922 and 924. The destination carriage 146 can be moved so that the alignment hardware 150 is under the reference 126. The alignment hardware 150 coupled to the destination carriage 146 is used to align the destination carriage 146 to one or more alignment marks of the reference 126. The alignment of components within the apparatus 100 may drift due to a temperature change, vibration, or another cause. The alignment can be performed under the control of the controller 160 or a local controller. The alignment can be performed more than once per transfer operation and may be performed on average about one time per transfer cycle.

The method can include measuring alignment of the set of dies held by the array of bonding heads using the alignment hardware at block 934 in FIG. 9. Referring to FIG. 22, after the dies 1522 are transferred to the array of bonding heads 124, the pick-up head carriage 142 and the destination carriage 146 are moved to the left. While the alignment hardware 150 is under the dies 1522, one or more alignment measurements can be taken. Die chucks for the bonding heads within the array of bonding heads 124 can allow for limited motion. The die chucks can be moved to reduce the amount of misalignment. The amount of misalignment will be no greater than an allowable tolerance. If the misalignment is within tolerance, the method can continue. If the misalignment is outside tolerance, a signal can be transmitted to the controller 160 or local controller with such information. The method can be suspended until human intervention occurs. The continued description of the method is based on the misalignment being within tolerance or human or other intervention was successful.

Figure 23:
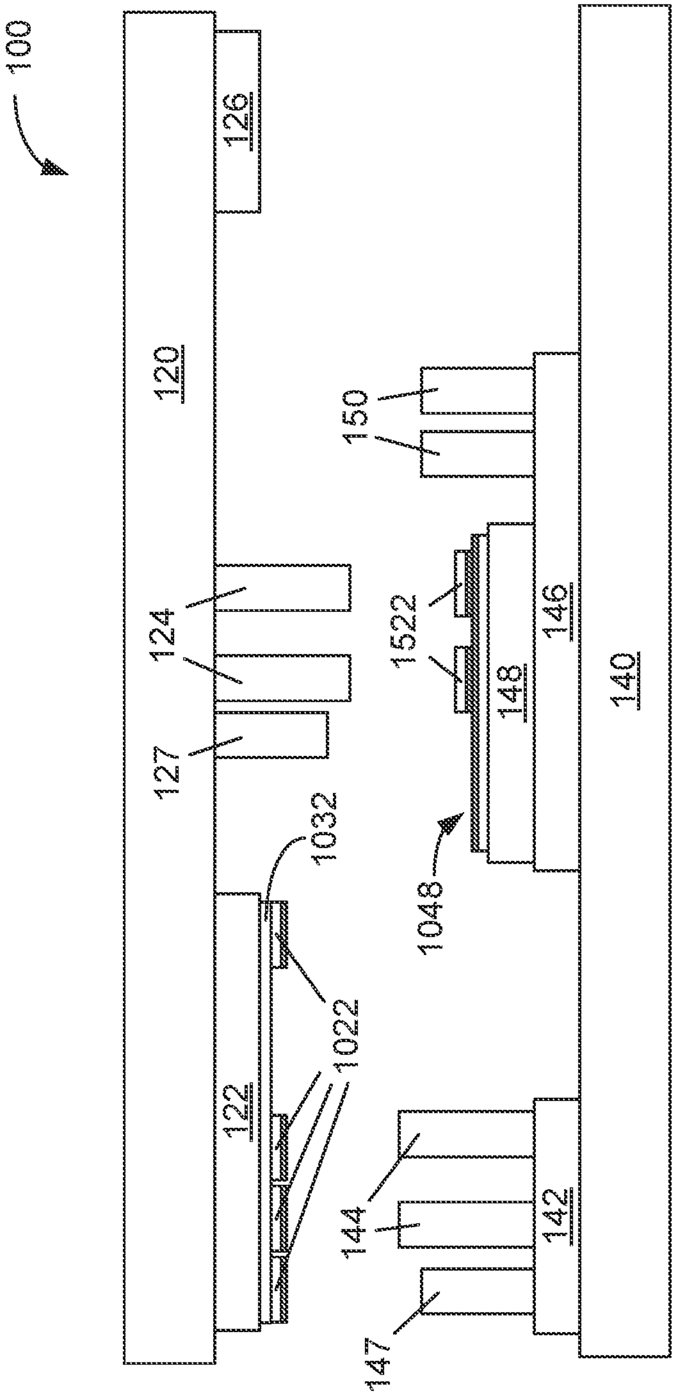
FIG. 23 includes an illustration of a cross-sectional view of the apparatus of FIG. 22 after bonding the set of dies to destination bonding sites of the destination substrate.

The method can further include bonding the set of dies to the corresponding destination bonding sites of the destination substrate at block 936 in FIG. 9. FIG. 23 includes a cross-sectional view of the apparatus 100 after the dies 1522 are bonded to corresponding destination bonding sites of the destination chuck 148. The die chucks for the array of bonding heads 124 can be extended toward the destination substrate 1048, the destination chuck 148 can be extended toward the array of bonding heads 124, or both. The controller 160 or a local controller can transmit a signal for the movement of the die chucks for the array of bonding heads 124, the destination chuck 148, or both.

Pressure is exerted to bond the dies 1522 to the destination bonding sites of the destination substrate 1048 to each other. In an embodiment, the bonds can be oxide-to-oxide bonds. The pressure during bonding can be in a range 0.5 N/cm$^2$ to 20 N/cm$^2$. The bonding can be performed at room temperature (for example, at a temperature in a range from 20° C. to 25° C.) or higher. Bonding is performed at a temperature less than a subsequent anneal to expand conductive metal within the dies and at the destination bonding sites. The temperature and pressure may be limited depending on films present during bonding or components within the apparatus 100. For example, the temperature may be no higher than approximately 200° C. After reading this specification, skilled artisans will be able to determine the pressure and temperature used for bonding. The controller 160 or a local controller can transmit an instruction to allow sufficient pressure to be generated for the bonding operation. At this point in the method, one transfer cycle has been completed for the set of dies that include the dies 1522.

A determination is made whether more dies are to be transferred from the source substrate to the destination substrate at decision diamond 942 in FIG. 9. If more dies are to be transferred ("YES" branch), the method continues starting at block 842 in FIG. 8 with a new set of dies transferred during another transfer cycle. The method can be iterated as many times as needed for the destination substrate 1048 to have a desired number of dies. If no more dies are to be transferred ("NO" branch from decision diamond 942 in FIG. 9), the transfer operation is completed, and the method of transferring dies ends.

A hybrid bonding process can include three steps that include a bonding operation, a first anneal to cause the metal within the dies and at the destination bonding sites to expand and contact each other, and a second anneal to cause metal atoms to cross the metal-metal interface and reduce contact resistance. The method previously described with respect to the flow chart in FIGS. 8 and 9 and as described and illustrated in FIGS. 10, 14, 15, 21 to 23 can correspond to the bonding operation of a hybrid bonding process. The destination substrate 1048 can be removed from the apparatus 100 or moved to a different portion of the apparatus 100 or a different tool to perform the anneal operations.

Many previously described embodiments have non-contact pick-up chucks within the array of pickup heads 144. In another embodiment, the array of bonding heads 124 may have non-contact bonding heads. The non-contact bonding chucks can be advantageous when the back sides of the set of dies 1522 have activated surfaces. The non-contact bonding heads can reduce the likelihood that an activated surface becomes deactivated by the array of bonding heads 124 or that a particle or contaminant is transferred from the array of bonding heads 124 to the dies 1522 during a transfer cycle. Further, the non-contact bonding heads can allow thin dies (thickness less than 100 microns) to held without the need to form die structures having backing plates. Thus, the concepts described herein can be used for die transfer heads and are not limited to pick-up heads or bonding heads.

Embodiments described herein allow for less force to be used when picking up dies during a die transfer operation. Embodiments can allow for less contact area between an adhesive material of a die substrate and a contacting side of a die. A gas flow rate for a Bernoulli chuck or a vacuum to be drawn when removing the die from the die substrate can be less as compared to a configuration where a convention planar substrate chuck and conventional die substrate are used. Thus, equipment in support of a Bernoulli chuck or a vacuum system used with the apparatus 100 may be less aggressively designed because it will not require a relatively larger gas flow or a relative stronger vacuum as compared to another apparatus that does not have the features or use the techniques as described herein.

Embodiments are particularly well suited for non-contact die chucks that include Bernoulli chucks. Referring to the dies 1522 being picked up as illustrated in FIG. 16, the gas flow is directed away from the centers of the dies along the device sides of the dies. The gas flow causes lower pressure along the device sides of the dies 1522 and higher pressure along the back sides of the dies 1522. When the gas flow to the side of the die opposite the Bernoulli chuck is blocked or substantially impeded by an adhesive layer of a source substrate, removing dies from the source substrate may be impossible or, in a best case scenario, extremely difficult and require excessively high gas flows from the Bernoulli chucks.

US 2021/0060798 discloses removal of a die from tape when aided by the use of push pins within a substrate chuck. Push pins can be used to generate a gap between a portion of the die and an adhesive material of the tape; however, push pins are not a good choice for assisting in non-contact picking up dies in commercial production where an apparatus is to transfer dies having different die sizes, layouts, or both. The layout of the push pins within the substrate chuck are set by the substrate chuck manufacturer and the layout of the push pins cannot feasibly be changed after the substrate chuck is installed into a die transfer apparatus. The likelihood that all source substrates to be used with the apparatus 100 will have the same die layout as the layout of the push pins is very small.

Further, the contact area of the push pins may not allow push pins to be used for a variety of different die sizes. The contact area of a push pin may correspond to an average area occupied by the back side of the dies to be transferred from the source substrate to a destination substrate. During a transfer operation, dies occupying a relatively larger area, such as microprocessors, are to be bonded to the destination substrate, and during a different transfer operation, dies occupying a small area, such as a memory die or a chiplet, are to be bonded to the destination substrate. One push pin may be insufficient to work properly with a die occupying a relatively large area, and such one push pin may lift a plurality dies where each of the dies occupies a relatively small area.

Still further, even if the layout and contact area of the push pins are well suited for dies on a source substrate, picking up immediately adjacent dies will be difficult. Immediately adjacent dies may be separated by a small gap corresponding to a width of a cutting tool used to singulate die, such as a saw blade, a laser, a water jet, or the like. Widths of scribe lanes can be in a range of 20 microns to 200 microns. The cutting tool defines a cut lane that is a gap between dies, and the cut lane needs to have a width that is smaller than the widths of the scribe lanes. The cut lane between the immediately adjacent dies is much smaller than each of the lengths and widths of the dies. When using push pins for immediately adjacent dies, the adhesive material will remain in contact with the dies near the gap between the dies. The gas flow around such dies is impeded and makes picking up immediately adjacent dies during the same transfer cycle more difficult.

As previously described, a source chuck may include push pins that can be used to assist in the removal of die from a source substrate. The push pins can be used in conjunction with the source substrate 1032*a* that has a patterned adhesive layer or with the source substrate 1032*b* that contacts only part, and not all of a side, such as a back side or a device side, of a die. Thus, the push pins can be used during a transfer operation in conjunction with the teachings herein, but the use of push pins should not be used as a substitute for the lower contact area that occurs with a patterned adhesive layer or a deformed source substrate.

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. An apparatus, comprising:
a first pick-up head including a first non-contact die chuck for holding a first die, wherein the first die is associated with a source substrate;
a substrate chuck having a non-planar chucking surface configured to hold the source substrate, wherein the non-planar chucking surface includes a plurality of concentric rings, pyramidal shapes, conical shapes, or hemispheres, and wherein the plurality of concentric rings, pyramidal shapes, conical shapes, or hemispheres is configured such that deformation of the source substrate reduces an amount of contact area between the source substrate and the first die; and
a substrate retention module having:
a vacuum manifold; and
a vacuum port, wherein along the non-planar chucking surface, the vacuum port is disposed along a valley between a pair of the concentric rings, the pyramidal shapes, the conical shapes, or the hemispheres, and the vacuum port is fluidly coupled between the valley and the vacuum manifold,
wherein the substrate retention module is configured to provide a force in a direction from the source substrate toward the substrate chuck, wherein the force is sufficient to deform the source substrate.

2. The apparatus of claim 1, wherein:
the apparatus comprises an array of pick-up heads including the first pick-up head and a second pick-up head including a second non-contact die chuck,
the first pick-up head and the second pick-up head are configured to pick up the first die and a second die that are at an original die pitch along the source substrate, and
the first pick-up head and the second pick-up head are configured to change from the original die pitch to a different pitch for transfer to bonding heads.

3. The apparatus of claim 1, wherein the non-planar chucking surface of the substrate chuck has a feature pitch that is less than a smaller of a length and a width of the first die.

4. The apparatus of claim 1, wherein the first non-contact die chuck is adapted to not contact the first die when the first die is held by the first non-contact die chuck.

5. The apparatus of claim 1, wherein the first pick-up head comprises a die retention module.

6. The apparatus of claim 5, wherein the die retention module comprises a pressure source and a pressure actuator.

7. The apparatus of claim 5, wherein the die retention module comprises a vacuum source and a vacuum actuator.

8. The apparatus of claim 1, further comprising a bonding head configured to receive the first die from the first pick-up head and bond the first die to a destination substrate.

9. The apparatus of claim 1, further comprising a piezoelectric transducer that is a part of or coupled to the first pick-up head.

10. The apparatus of claim 1, wherein the first non-contact die chuck comprises a Bernoulli chuck.

11. The apparatus of claim 1, wherein the substrate chuck includes features along the non-planar chucking surface, wherein the features are arranged at a feature pitch.

12. A method, comprising:
placing a source substrate along a non-planar chucking surface of a source chuck of an apparatus, wherein:
a first die is associated with the source substrate, and
the apparatus includes:
a first pick-up head including a first non-contact die chuck for holding the first die, wherein the first die is associated with the source substrate;
the source chuck having the non-planar chucking surface configured to hold the source substrate, wherein the non-planar chucking surface includes a plurality of concentric rings, pyramidal shapes, conical shapes, or hemispheres, and wherein the plurality of concentric rings, pyramidal shapes, conical shapes, or hemispheres is configured such that deformation of the source substrate reduces an amount of contact area between the source substrate and the first die; and
a substrate retention module having:
a vacuum manifold; and a vacuum port, wherein along the non-planar chucking surface, the vacuum port is disposed along a valley between a pair of the concentric rings, the pyramidal shapes, the conical shapes, or the hemispheres, and the vacuum port is fluidly coupled between the valley and the vacuum manifold, wherein the substrate retention module is configured to provide a force in a direction from the source substrate toward the source chuck, wherein the force is sufficient to deform the source substrate; and picking up the first die using the first pick-up head having the first non-contact die chuck, wherein before picking up the first die, the source substrate contacts spaced-apart portions of the first die, and the source substrate does not contact another portion of first die between the spaced-apart portions of the source substrate.

13. The method of claim 12, further comprising activating the substrate retention module, wherein the substrate retention module provides the force on the source substrate in the direction from the source substrate toward the source chuck and deforms the source substrate, and activating the substrate retention module is performed such that the source substrate is deformed before picking up the first die.

14. The method of claim 13, wherein activating the substrate retention module is performed such that the source substrate at least partially conforms to the non-planar chucking surface of the source chuck.

15. The method of claim 12, wherein picking up the first die comprises activating a die retention module, and during picking up the first die, a gas flows between the spaced-apart portions of the source substrate and the first die.

16. The method of claim 12, wherein before placing the source substrate along the non-planar chucking surface of the source chuck, the source substrate contacts the spaced-apart portions of the first die, and the source substrate does not contact another portion of the first die between the spaced-apart portions of the source substrate.

17. The method of claim 12, wherein:

placing the source substrate along the non-planar chucking surface of the source chuck comprises placing the source substrate along the non-planar chucking surface, wherein a plurality of dies is associated with the source substrate, wherein the plurality of dies includes the first die and a second die that are immediately adjacent to and along opposite sides of a cut lane, picking up the first die comprises picking up the first die with the first pick-up head and picking up the second die with a second pick-up head having a second non-contact die chuck, wherein the first pick-up head and second pick-up head are at a source-matching pitch, and the method further includes:

changing the first pick-up head and the second pick-up head from the source-matching pitch to a bonding head-matching pitch; and bonding the first die and the second die to destination bonding sites of a destination substrate, wherein the destination substrate is coupled to a destination chuck, and the destination substrate has a corresponding first die location and a corresponding second die location that are at a destination pitch.

18. The method of claim 12, wherein:

placing the source substrate along the non-planar chucking surface of the source chuck comprises placing the source substrate along the non-planar chucking surface, wherein a plurality of dies is associated with the source substrate, wherein the plurality of dies includes the first die and a second die that face a first direction, picking up the first die comprises picking up the first die with the first pick-up head and picking up the second die with a second pick-up head having a second non-contact die chuck, wherein the first non-contact die chuck and the second non-contact die chuck have pick-up surfaces that face a second direction opposite the first direction, and the first pick-up head and second pick-up head are at a source-matching pitch, and the method further includes:

changing the first pick-up head and the second pick-up head from the source-matching pitch to a bonding head-matching pitch;

transferring the first die to a first bonding head and the second die to a second bonding head; and bonding the first die to a first destination bonding site of a destination substrate and the second die to a second destination bonding site of the destination substrate, wherein the destination substrate is coupled to a destination chuck, and the first destination bonding site and the second destination bonding site face the second direction and are at a destination pitch.

19. The method of claim 18, wherein during placing the source substrate, picking up the first die and the second die, changing the first pick-up head and the second pick-up head from the source-matching pitch to the bonding head-matching pitch, transferring the first die to the first bonding head and the second die to the second bonding head, and bonding the first die and the second die, activated surfaces of the first die and the second die face the first direction.

20. The method of claim 12, wherein picking up the first die is performed while a plurality of push pins within the source chuck are in a retracted state.

21. The method of claim 12, wherein picking up the first die is performed such that the first die does not contact the first non-contact die chuck.

* * * * *